(12) United States Patent
Lee

(10) Patent No.: US 11,275,205 B2
(45) Date of Patent: Mar. 15, 2022

(54) METHODS OF IMPROVING EFFICIENCY OF DISPLAYS USING QUANTUM DOTS WITH INTEGRATED OPTICAL ELEMENTS

(71) Applicant: NANOSYS, Inc., Milpitas, CA (US)

(72) Inventor: Ernest Chung-Wei Lee, Palo Alto, CA (US)

(73) Assignee: NANOSYS, Inc., Milpitas, CA (US)

( * ) Notice: Subject to any disclaimer, the term of this patent is extended or adjusted under 35 U.S.C. 154(b) by 0 days.

(21) Appl. No.: 16/521,325

(22) Filed: Jul. 24, 2019

(65) Prior Publication Data
US 2020/0033527 A1    Jan. 30, 2020

Related U.S. Application Data

(60) Provisional application No. 62/702,776, filed on Jul. 24, 2018.

(51) Int. Cl.
*F21V 8/00* (2006.01)
*G02F 1/1335* (2006.01)
(Continued)

(52) U.S. Cl.
CPC ......... *G02B 6/0053* (2013.01); *G02B 6/0043* (2013.01); *G02F 1/133512* (2013.01);
(Continued)

(58) Field of Classification Search
None
See application file for complete search history.

(56) References Cited

U.S. PATENT DOCUMENTS 7,722,225 B2 *  5/2010  Hwang ................ G02B 5/0226
                                                            362/331
8,033,706 B1 * 10/2011  Kelly .................. G02B 6/0036
                                                            362/307
(Continued)

FOREIGN PATENT DOCUMENTS

CN         104728779 A      6/2015

OTHER PUBLICATIONS

International Search Report and Written Opinion of the International Searching Authority directed to related International Application No. PCT/US2019/043156, dated Oct. 25, 2019; 5 pages.

*Primary Examiner* — Keith G. Delahoussaye
(74) *Attorney, Agent, or Firm* — Sterne, Kessler, Goldstein & Fox P.L.L.C.

(57) ABSTRACT

A display device is provided having a quantum dot formed directly on a surface or substrate of a backlight unit, without requiring an intervening layer. An optically transmissive layer is formed thereon. The quantum dot film may be provided that includes a population of optical features to permit the omission of additional films, such as a separate optical film. A population of optical features may include a population of embedded microspheres to achieve optical effects, to improve the overall thickness uniformity of the quantum dot film, or both. Additionally or alternatively, the quantum dot film may be provided having optical features embossed thereon, such as reflective and/or refractive features, prisms, grooves, grooved prisms, lenticular lenses, micro-lenses, micro-spheres, any other lenses, pitches, or other suitable brightness enhancement and/or optical features. Thereby, a separate optical film may be omitted from the overall device structure.

24 Claims, 12 Drawing Sheets

(51) Int. Cl.
*G02F 1/13357* (2006.01)
*H01L 31/0352* (2006.01)
*H01L 51/50* (2006.01)

(52) U.S. Cl.
CPC .. *G02F 1/133606* (2013.01); *G02F 1/133615* (2013.01); *G02F 1/133617* (2013.01); *G02F 1/133603* (2013.01); *G02F 1/133607* (2021.01); *G02F 1/133614* (2021.01); *H01L 31/035218* (2013.01); *H01L 51/5028* (2013.01)

(56) References Cited

U.S. PATENT DOCUMENTS

| | | | |
|---|---|---|---|
| 8,192,829 B2* | 6/2012 | Sturley | E01C 5/22 |
| | | | 428/156 |
| 2002/0114169 A1* | 8/2002 | Harada | F21V 3/04 |
| | | | 362/558 |
| 2012/0113672 A1 | 5/2012 | Dubrow et al. | |
| 2012/0170282 A1* | 7/2012 | Lin | G02B 6/0036 |
| | | | 362/341 |
| 2015/0285444 A1* | 10/2015 | Choi | G02B 5/201 |
| | | | 362/84 |
| 2016/0077273 A1* | 3/2016 | Kim | G02B 6/0053 |
| | | | 362/633 |
| 2016/0097889 A1* | 4/2016 | Kim | G02B 6/005 |
| | | | 362/607 |
| 2018/0364408 A1* | 12/2018 | Hwang | G02F 1/133504 |
| 2019/0377119 A1* | 12/2019 | Jang | G02B 6/005 |

* cited by examiner

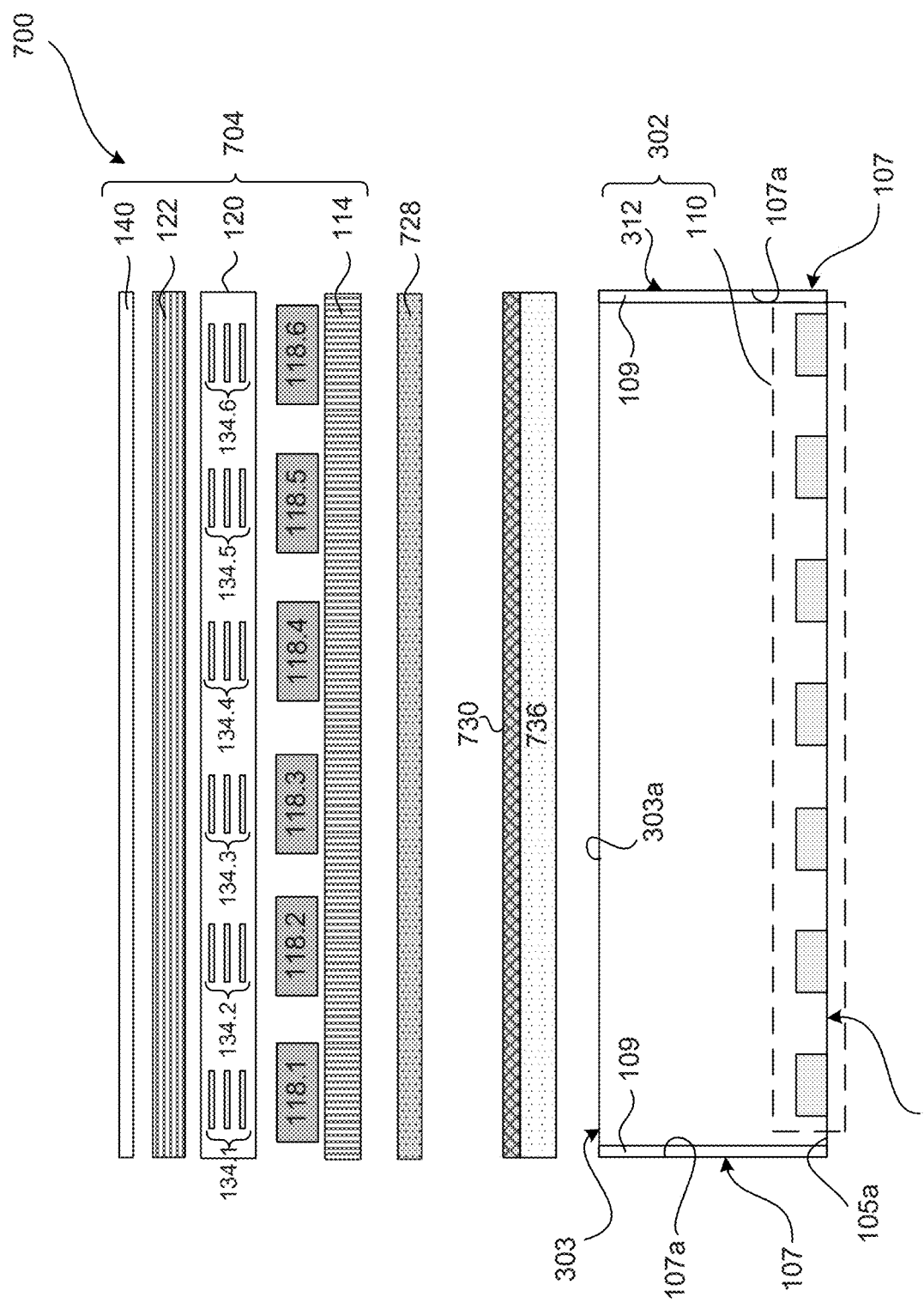

METHODS OF IMPROVING EFFICIENCY OF DISPLAYS USING QUANTUM DOTS WITH INTEGRATED OPTICAL ELEMENTS

CROSS REFERENCE TO RELATED APPLICATION

The present application claims the benefit of U.S. Provisional Patent Appl. No. 62/702,776, filed Jul. 24, 2018, titled "Methods Of Improving Efficiency Of Displays Using Quantum Dots With Integrated Optical Elements," which is incorporated herein by reference in its entirety.

FIELD

This disclosure is generally related to display devices and, more specifically, display devices including luminescent nanocrystals such as quantum dots (QDs).

BACKGROUND

Display devices (e.g., liquid crystal displays (LCDs)) are used as screens or displays for a wide variety of electronic devices and typically require some form of backlighting for images to be visible in normal or reduced ambient light environments. In a backlight unit (BLU) of the display device, LEDs are typically utilized as a light source. The LEDs may be arranged around the edge or perimeter of the display device. The BLU may also utilize phosphors, such as yttrium-aluminum-garnet (YAG) phosphors. Luminescent nanocrystals represent a new, alternative class of phosphors often used in configurations where the phosphor may be placed external to the LEDs. Light emanating from the LEDs may be processed through a light guide plate (LGP) and a phosphor film of the display device to produce white light, which may be distributed across a display screen of the display device. For example, luminescent nanocrystals may be embedded in a flexible film/sheet (e.g., quantum dot enhancement film (QDEF) supplied commercially from 3M Company, St. Paul. Minn. using quantum dots supplied by Nanosys, Inc, Milpitas, Calif.) that may be placed above the LGP of the display device (see, e.g., U.S. Patent Publication Nos. 2010/0110728 and 2012/0113672, which are incorporated by reference herein in their entirety). In other examples, luminescent nanocrystals may be encapsulated in a container, for example a capillary, which may be placed between the LEDs and the LGP (see, e.g., U.S. Patent Publication No. 2010/0110728).

SUMMARY OF THE INVENTION

Consumer demand for thin display devices is surging. However, it may be difficult for manufacturers to achieve reductions in display device thickness without sacrificing display quality or performance. For example, generally a display device may require an optical film (also referred to as an optical feature film) to achieve sufficient quality brightness and optical characteristics. Reducing the dimensions of an optical film may affect the capability of the film to direct light off-axis or otherwise enhance optical features of display light. This disclosure provides a display device that maintains expected quality and performance while eliminating or combining layers and achieving desirable reductions in overall device thickness.

According to some embodiments, a display device can be formed having reduced device thickness by forming a quantum dot layer on a surface or substrate of a light guide plate. Because a light guide plate can be formed of a thin, structurally rigid material (such as glass or the like), a quantum dot layer can be formed directly thereon without requiring an intervening layer.

According to some embodiments, a display device is provided that can include a quantum dot layer on a surface of a light guide plate, without an intervening layer, and a barrier layer formed thereon. Additionally, a quantum dot film can be provided that includes a population of optical features to permit the omission of additional films, such as a separate optical film.

According to some embodiments, a display device is provided that can include a quantum dot layer on a surface of a light guide plate without an intervening layer. The quantum dot film can be provided having a population of embedded microspheres to achieve optical effects without a separate optical film. In some embodiments, the microspheres can have sizes distributed irregularly to improve the overall thickness uniformity of the quantum dot film.

According to some embodiments, a display device is provided that can include a quantum dot layer on a surface of a light guide plate without an intervening layer. The quantum dot film can be provided having one or more optical features, such as reflective and/or refractive features, prisms, grooves, grooved prisms, lenticular lenses, micro-lenses, micro-spheres, any other lenses, pitches, or other suitable brightness enhancement and/or optical features. Thereby, a separate optical film can be omitted from the overall device structure.

Further embodiments, features, and advantages of the invention, as well as the structure and operation of the various embodiments, are described in detail below with reference to accompanying drawings.

BRIEF DESCRIPTION OF THE DRAWINGS

The accompanying drawings, which are incorporated herein and form part of the specification, illustrate the present disclosure and, together with the description, further serve to explain the principles of the disclosure and to enable a person skilled in the relevant art to make and use the disclosure.

FIG. 7 is an exploded cross-sectional view of a liquid crystal display (LCD) devices, according to an embodiment.

DETAILED DESCRIPTION

Figure 1:
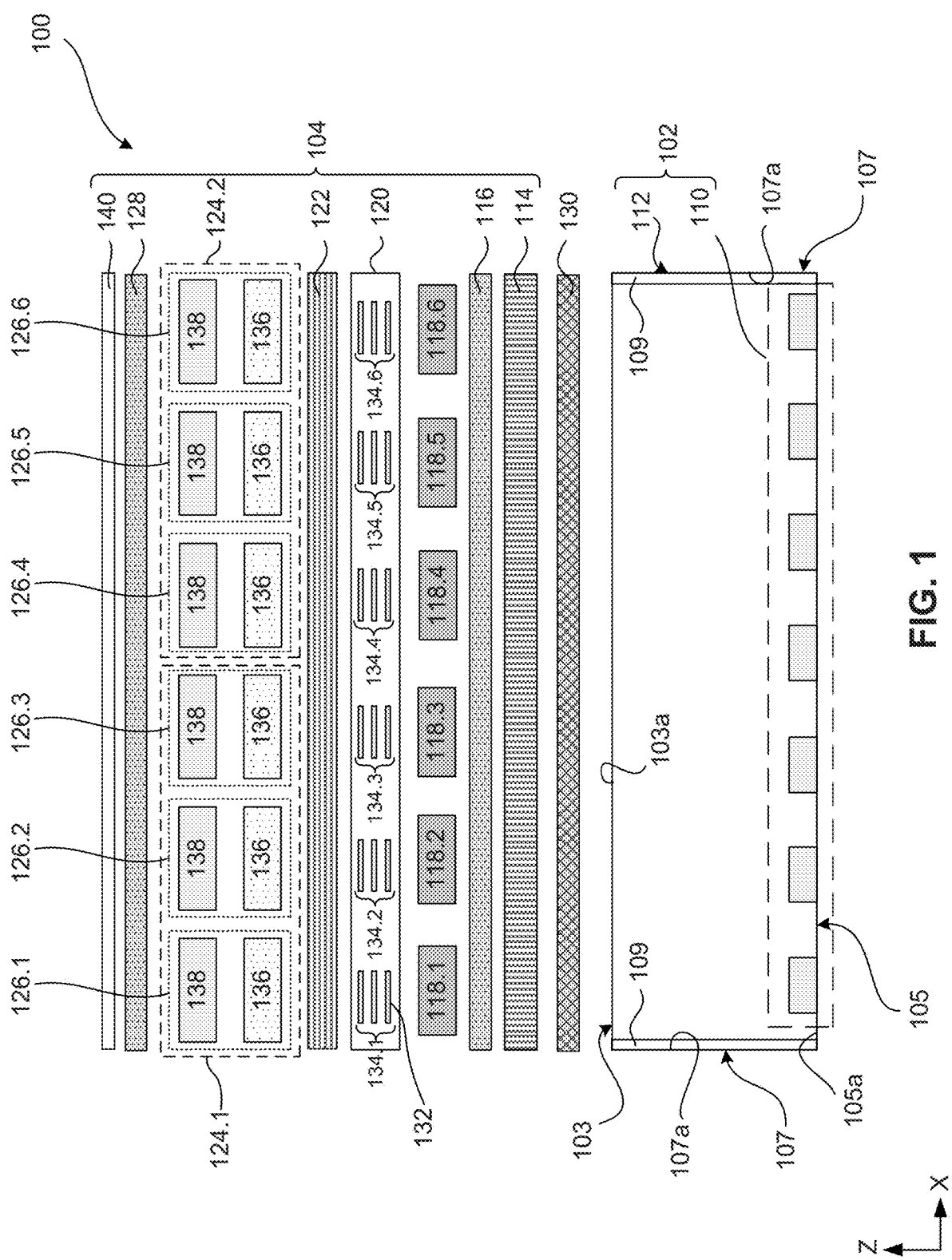
FIGS. 1 and 2 are exploded cross-sectional views of liquid crystal display (LCD) devices, according to an embodiment.

Although specific configurations and arrangements may be discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications beyond those specifically mentioned herein. It should be appreciated that the particular implementations shown and described herein are examples and are not intended to otherwise limit the scope of the application in any way.

It is noted that references in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

All numbers in this description indicating amounts, ratios of materials, physical properties of materials, and/or use are to be understood as modified by the word "about," except as otherwise explicitly indicated.

In embodiments, the term "display device" refers to an arrangement of elements that allow for the visible representation of data on a display screen. Suitable display screens may include various flat, curved or otherwise-shaped screens, films, sheets or other structures for displaying information visually to a user. Display devices described herein may be included in, for example, display systems encompassing a liquid crystal display (LCD), televisions, computers, mobile phones, smart phones, personal digital assistants (PDAs), gaming devices, electronic reading devices, digital cameras, tablets, wearable devices, car navigation systems, and the like.

The term "about" as used herein indicates the value of a given quantity varies by ±10% of the value. For example, "about 100 nm" encompasses a range of sizes from 90 nm to 110 nm, inclusive.

The term "substantially" as used herein indicates the value of a given quantity varies by ±1% to ±5% of the value.

In embodiments, the terms "light guide plate," "light guide," and "light guide panel" are used interchangeably and refer to an optical component that is suitable for directing electromagnetic radiation (light) from one position to another.

In embodiments, the term "optically coupled" means that components are positioned such that light is able to pass from one component to another component without substantial interference.

The term "nanostructure" as used herein refers to a structure having at least one region or characteristic dimension with a dimension of less than about 500 nm. In some embodiments, the nanostructure has a dimension of less than about 200 nm, less than about 100 nm, less than about 50 nm, less than about 20 nm, or less than about 10 nm. Typically, the region or characteristic dimension will be along the smallest axis of the structure. Examples of such structures include nanowires, nanorods, nanotubes, branched nanostructures, nanotetrapods, tripods, bipods, nanocrystals, nanodots, QDs, nanoparticles, and the like. Nanostructures can be, e.g., substantially crystalline, substantially monocrystalline, polycrystalline, amorphous, or a combination thereof. In some embodiments, each of the three dimensions of the nanostructure has a dimension of less than about 500 nm, less than about 200 nm, less than about 100 nm, less than about 50 nm, less than about 20 nm, or less than about 10 nm.

The term "QD" or "nanocrystal" as used herein refers to nanostructures that are substantially monocrystalline. A nanocrystal has at least one region or characteristic dimension with a dimension of less than about 500 nm, and down to the order of less than about 1 nm. The terms "nanocrystal," "QD," "nanodot," and "dot," are readily understood by the ordinarily skilled artisan to represent like structures and are used herein interchangeably. The present invention also encompasses the use of polycrystalline or amorphous nanocrystals.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In some embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. A shell can but need not completely cover the adjacent materials to be considered a shell or for the nanostructure to be considered a heterostructure; for example, a nanocrystal characterized by a core of one material covered with small islands of a second material is a heterostructure. In other embodiments, the different material types are distributed at different locations within the nanostructure; e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

As used herein, the term "diameter" of a nanostructure refers to the diameter of a cross-section normal to a first axis of the nanostructure, where the first axis has the greatest difference in length with respect to the second and third axes (the second and third axes are the two axes whose lengths most nearly equal each other). The first axis is not necessarily the longest axis of the nanostructure; e.g., for a disk-shaped nanostructure, the cross-section would be a substantially circular cross-section normal to the short longitudinal axis of the disk. Where the cross-section is not circular, the diameter is the average of the major and minor axes of that cross-section. For an elongated or high aspect ratio nanostructure, such as a nanowire, the diameter is measured across a cross-section perpendicular to the longest axis of the nanowire. For a spherical nanostructure, the diameter is measured from one side to the other through the center of the sphere.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating can but need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell may contain non-crystalline regions and may even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

The term "ligand" as used herein refers to a molecule capable of interacting (whether weakly or strongly) with one or more faces of a nanostructure, e.g., through covalent, ionic, van der Waals, or other molecular interactions with the surface of the nanostructure.

The term "quantum yield" (QY) as used herein refers to the ratio of photons emitted to photons absorbed, e.g., by a nanostructure or population of nanostructures. As known in the art, quantum yield is typically determined by a comparative method using well-characterized standard samples with known quantum yield values.

The term "primary emission peak wavelength" as used herein refers to the wavelength at which the emission spectrum exhibits the highest intensity.

The term "full width at half-maximum" (FWHM) as used herein refers to refers to a measure of spectral width. In the case of an emission spectrum, a FWHM can refer to a width of the emission spectrum at half of a peak intensity value.

The term Forster radius used herein is also referred as Forster distance in the art.

The terms "luminance" and "brightness" are used herein interchangeably and refer to a photometric measure of a luminous intensity per unit area of a light source or an illuminated surface.

The terms "specular reflectors," "specularly reflective surfaces," and "reflective surfaces" are used herein to refer to elements, materials, and/or surfaces capable of specular reflection.

The term "specular reflection" is used herein to refer to a mirror-like reflection of light (or of other kinds of wave) from a surface, when an incident light hits the surface.

The term "nanostructure (NS) film" is used herein to refer to a film having luminescent nanostructures.

The term "red sub-pixel" is used herein to refer to an area of a pixel that emits light having a primary emission peak wavelength in the red wavelength region of the visible spectrum. In some embodiments, the red wavelength region may include wavelengths ranging from about 620 nm to about 750 nm.

The term "green sub-pixel" is used herein to refer to an area of a pixel that emits light having a primary emission peak wavelength in the green wavelength region of the visible spectrum. In some embodiments, the green wavelength region may include wavelengths ranging from about 495 nm to about 570 nm.

The term "blue sub-pixel" is used herein to refer to an area of a pixel that emits light having a primary emission peak wavelength in the blue wavelength region of the visible spectrum. In some embodiments, the blue wavelength region may include wavelengths ranging from about 435 nm to about 495 nm.

The term "emissive surface of a sub-pixel" is used herein to refer to a surface of a topmost layer of the sub-pixel from which light is emitted towards a display screen of a display device.

The published patents, patent applications, websites, company names, and scientific literature referred to herein are hereby incorporated by reference in their entirety to the same extent as if each was specifically and individually indicated to be incorporated by reference. Any conflict between any reference cited herein and the specific teachings of this specification shall be resolved in favor of the latter. Likewise, any conflict between an art-understood definition of a word or phrase and a definition of the word or phrase as specifically taught in this specification shall be resolved in favor of the latter.

Technical and scientific terms used herein have the meaning commonly understood by one of skill in the art to which the present application pertains, unless otherwise defined. Reference is made herein to various methodologies and materials known to those of skill in the art.

Overview

This disclosure provides various embodiments of nanostructure-based display devices that help to reduce overall display device size by enabling the omission of layers and/or combining layers. Some embodiments also help to improve display stability and performance by improving the thickness uniformity of a quantum dot film (also referred to herein as a QD film or a phosphor film).

Example Embodiments of a Liquid Crystal Display (LCD) Device

FIG. 1 illustrates a schematic of an exploded cross-sectional view of an LCD display device 100, according to an embodiment. A person of ordinary skill in the art will recognize that the view of display device in FIG. 1 is shown for illustration purposes and may not be drawn to scale. LCD display device 100 can include a backlight unit (BLU) 102 and an LCD module 104, according to an embodiment.

BLU 102 can include an optical cavity 112 and an array of light emitting diodes (LEDs) 110 (e.g., white LEDs, blue LEDs, UV LEDs or a combination thereof) coupled to optical cavity 112. In an embodiment, LEDs 110 only include blue LEDs and UV LEDs in a given ratio. Optical cavity 112 can include a top side 103, a bottom side 105, sidewalls 107, and a closed volume confined by top side 103, bottom side 105, and sidewalls 107. LEDs 110 can be coupled to a top surface 105a of bottom side 105 within the closed volume. LEDs 110 can be configured to provide a primary light (e.g., blue light, white light, UV light, or a combination of blue light and UV light) that may be processed through LCD module 104 and subsequently, transmitted to and distributed across a display screen 140 of LCD display device 100. In some embodiments, LEDs 110 comprise blue LEDs that emit light having a peak emission wavelength between about 440 nm and about 470 nm, or between about 445 nm and about 455 nm. In some embodiments, LEDs 110 comprise white LEDs that emit light in the range from about 440 nm to about 700 nm or other possible light wavelength ranges. In some embodiments, LEDs 110 comprise UV LEDs that emit light having a peak emission wavelength that is less than 420 nm, or that is between about 400 nm and about 410 nm, or that is between about 360 nm and about 370 nm. In an embodiment, the array of LEDs 110 can comprise a two-dimensional array of LEDs that are spread across an area of top surface 105a and the area may be equal to the surface area of display screen 140.

It should be noted that even though two sidewalls 107 are shown in FIG. 1, a person skilled in the art would understand that optical cavity 112 can include any number of sidewalls 107, according to various embodiments. For example, optical cavity 112 can have a cuboid shape and can include four sidewalls similar to sidewalls 107. Optical cavity 112 is not restricted to being cuboid in shape or having other straight-sided shapes. Optical cavity 112 can be configured to be any type of geometric shape, such as but not limited to cylindrical, trapezoidal, spherical, or elliptical, according to various embodiments, without departing from the spirit and scope of the present invention. It should also be noted that the rectangular cross-sectional shape of optical cavity 112, as illustrated in FIG. 1, is for illustrative purposes, and is not limiting. Optical cavity 112 can have other cross-sectional shapes (e.g., trapezoid, oblong, rhomboid), according to various embodiments, without departing from the spirit and scope of the present invention.

Top side 103 of optical cavity 112 can be configured to be an optically diffusive and transmissive layer such that light from LEDs 110 can exit optical cavity 112 through top side 103 with a substantially uniform distribution of brightness across top surface 103a of top side 103. In an embodiment, top side 103 can include optically transparent areas and optically translucent areas that are strategically arranged over LEDs 110 to provide the substantially uniform distribution in light brightness exiting top side 103. In another embodiment, top side 103 can include pores of varying sizes in diameters and optically translucent areas that are strategically arranged to provide the substantially uniform distribution in light brightness exiting top side 103.

Bottom side 105 and/or sidewalls 107 can be constructed from one or more materials (e.g., metals, non-metals, and/or alloys) that are configured to have specularly reflective top surface 105a and/or specularly reflective side wall interior surfaces 107a, respectively. For example, top surface 105a and/or side wall interior surfaces 107a can be mirror-like surfaces having mirror-like reflection properties. In some embodiments, top surface 105a and/or side wall interior surfaces 107a can be completely specularly reflective or partially specularly reflective and partially scattering. In some other embodiments, top surface 105a and/or side wall interior surfaces 107a include diffuse reflectors.

In alternate embodiments, optical cavity 112 can include specular reflectors 109 coupled to sidewall interior surfaces 107a. Specular reflectors 109 can be coupled to sidewall interior surfaces 107a using optically transparent adhesive. The optically transparent adhesive may comprise tape, various glues, polymeric compositions such as silicones, etc. Additional optically transparent adhesive may include various polymers, including, but not limited to, poly(vinyl butyral), poly(vinyl acetate), epoxies, and urethanes; silicone and derivatives of silicone, including, but not limited to, polyphenylmethylsiloxane, polyphenylalkylsiloxane, polydiphenylsiloxane, polydialkylsiloxane, fluorinated silicones and vinyl and hydride substituted silicones; acrylic polymers and copolymers formed from monomers including, but not limited to, methylmethacrylate, butylmethacrylate, and laurylmethacrylate; styrene based polymers; and polymers that are cross linked with difunctional monomers, such as divinylbenzene, according to various examples.

Specularly reflective top surface 105a and side wall interior surfaces 107a and specular reflectors 109 can substantially minimize absorption of light from LEDs 110 through bottom side 105 and/or side walls 107 and thus, substantially minimize loss of luminance within optical cavity 112 and increase light output efficiency of BLU 102.

In some embodiments, LCD display device 100 can include an optical film 130 configured to exhibit brightness enhancement and other optical enhancement properties. In some embodiments including as described below, optical film 130 can include prisms, pitches, grooves, or other suitable brightness enhancement features, one or more reflective and/or refractive films, reflective polarizer films, light extraction features, light recycling features, lens films, prism films, groove films, grooved prism films, lenticular films, micro-lens (or micro-sphere) films, and/or other optical enhancement films. Optical film 130 may be configured, for example, to reflect a portion of the primary light (e.g., blue and UV light from optical cavity 112) back toward optical cavity 112, thereby providing recycling of the primary light.

LCD module 104 can be configured to process the light received from BLU 102 to desired characteristics for transmission to and distribution across display screen 140. In some embodiments, LCD module 104 can include one or more optical films 130, one or more polarizing filters, such as first and second polarizing filters 114 and 122, one or more optically transparent substrates such as first and second optically transparent substrates 116 and 128, switching devices 118.1 through 118.6 arranged in a 2-D array on first substrate 116, a liquid crystal (LC) solution layer 120, a plurality of pixels such as pixels 124.1 and 124.2 arranged in a 2-D array, and display screen 140.

In some embodiments, pixel 124.1 can include sub-pixels 126.1 through 126.3 and pixel 124.2 can include sub-pixels 126.4 through 126.6. In some embodiments, each of pixels 124.1 and 124.2 can be tri-chromatic, for example, having red sub-pixels 126.1 and 126.4, green sub-pixels 126.2 and 126.5, and blue sub-pixels 126.3 and 126.6, respectively.

The term "red sub-pixel" is used herein to refer to an area of a pixel that emits light having a primary emission peak wavelength in the red wavelength region of the visible spectrum. In some embodiments, the red wavelength region may include wavelengths ranging from about 620 nm to about 750 nm. The term "green sub-pixel" is used herein to refer to an area of a pixel that emits light having a primary emission peak wavelength in the green wavelength region of the visible spectrum. In some embodiments, the green wavelength region may include wavelengths ranging from about 495 nm to about 570 nm. The term "blue sub-pixel" is used herein to refer to an area of a pixel that emits light having a primary emission peak wavelength in the blue wavelength region of the visible spectrum. In some embodiments, the blue wavelength region may include wavelengths ranging from about 435 nm to about 495 nm.

The arrangement order of red, green, and blue sub-pixels 126.1 through 126.6 in respective pixels 124.1 and 124.2 is illustrative and is not limiting. The red, green, and blue sub-pixels in each of pixels 124.1 and 124.2 can be arranged in any order with respect to each other. In some embodiments, pixels 124.1 and/or 124.2 can be monochromatic having either red, green, or blue sub-pixels 126.1 through 126.6. The number of pixels and switching devices shown in FIG. 1 are illustrative and are not limiting. LCD module 104 can have any number of switching devices and pixels without departing from the spirit and scope of this disclosure.

Light from BLU 102 can be polarized through first polarizing filter 114 and the polarized light may be transmitted to LC solution layer 120. LC solution layer 120 can include LCs 132 having rod-shaped molecules that may act as shutters to control the amount of light transmission from LC solution layer 120. In some embodiments, LCs 132 can be arranged in a 3-D array. Columns 134.1 through 134.6 of the 3-D array of LCs may be independently controlled by respective switching devices 118.1 through 118.6. In some embodiments, switching devices 118.1 through 118.6 can comprise transistors, such as, for example, thin film transistors (TFTs). By controlling LCs 132, the amount of light travelling from columns 134.1 through 134.6 to respective sub-pixels 126.1 through 126.6 can be controlled, and consequently, the amount of light transmitting from sub-pixels 126.1 through 126.6 is controlled.

LCs 132 can be twisted to varying degrees depending on the voltage applied to columns 134.1 through 134.6 by respective switching devices 118.1 through 118.6. By controlling the twisting of LCs 132, the polarization angle of light passing through LC solution layer 120 can be controlled. Light leaving LC solution layer 120 can then pass through second polarizing filter 122 that can be positioned at 90 degrees with respect to first polarizing filter 114. The angle of polarization of the light leaving LC solution layer 120 and entering second polarizing filter 122 can determine how much of the light is able to pass through and exit from second polarizing filter 122. Second polarizing filter 122 can attenuate the light, block the light, or allow the light to pass without attenuation based on its angle of polarization.

Portions of light travelling through columns 134.1 through 134.6 of LCs and exiting out of second polarizing filter 122 can then enter respective ones of sub-pixels 126.1 through 126.6. These portions of light may undergo a stage of color filtering through the respective ones of sub-pixels 126.1 through 126.6 to achieve the desired optical characteristics for light distribution across display screen 140. In some embodiments, each of sub-pixels 126.1 through 126.6 can include QD film 136 that can include elements that down-convert portions of the received light entering sub-pixels 126.1 through 126.6.

QD films 136 can include luminescent nanostructures such as QDs (e.g., QD 600 described with reference to FIG. 6), according to some embodiments. QD films 136 can be down-converters, where the portions of light (also referred as primary light) entering the respective ones of sub-pixels 126.1 through 126.6 can be absorbed, for example, by the luminescent nanostructures in QD films 136 and re-emitted as secondary light having a lower energy or longer wavelength than the primary light.

In an embodiment where the primary light includes both blue and UV light, more of the UV light is absorbed by the luminescent nanostructures compared to the blue light for the same number of luminescent nanostructures. Furthermore, by replacing some of the blue light LEDs with UV LEDs in LEDs 110, the total amount of emitted blue light is decreased that can make it easier to filter the unwanted blue light in both the red sub-pixels 126.1 and 126.4 and green sub-pixels 126.2 and 126.5.

In some embodiments, QD films 136 of red sub-pixels 126.1 and 126.4 can include luminescent nanostructures that absorb the primary light and emit a first secondary light having a primary emission peak wavelength in the red wavelength region of the visible spectrum light. In some embodiments, QD films 136 of green sub-pixels 126.2 and 126.5 can include luminescent nanostructures that absorb the primary light and emit a second secondary light having a primary emission peak wavelength in the green wavelength region of the visible spectrum light. In some embodiments, QD films 136 of blue sub-pixels 126.3 and 126.6 can include luminescent nanostructures that absorb the primary light and emit a third secondary light having a primary emission peak wavelength in the blue wavelength region of the visible spectrum light.

In some embodiments, blue sub-pixels 126.3 and 126.6 can have non-phosphor films instead of QD films 136, or may have no film present at all. In some other embodiments, blue sub-pixels 126.3 and 126.6 include a scattering material instead of QD films 136. The scattering material may be used to provide an angular distribution of blue light from blue sub-pixels 126.3 and 126.6 that matches an angular distribution of light from the green sub-pixels 126.2 and 126.5, and red sub-pixels 126.1 and 126.4. The non-phosphor films may exclude luminescent nanostructures such as QDs and may be optically transmissive to blue light when BLU 102 includes blue LEDs, as there is no need for down-conversion of primary light from the blue LEDs for blue sub-pixels 126.3 and 126.6. In an embodiment where LEDs 110 includes both blue LEDs and UV LEDs, blue sub-pixels 126.3 and 126.6 can include a light blocking element 138 that comprises a UV blocking filter.

In some embodiments, QD films 136 can be segmented films that are placed adjacent to each other on second polarizing filter 122 or on an optically transparent substrate (not shown). The segmented QD films 136 can be placed in a manner such that there is negligible gap at interfaces between adjacent QD films 136 to prevent leakage of primary light through the interfaces. In alternate embodiments, each of QD films 136 can be different regions of a continuous phosphor film.

Additionally, each of sub-pixels 126.1 through 126.6 can include a light blocking element 138 disposed on QD film 136, according to some embodiments. The secondary light emitting from QD films 136 can be filtered through corresponding ones of light blocking elements 138 before travelling to display screen 140.

Light blocking elements 138 can be configured to allow the secondary light (e.g., first, second, and/or third secondary light discussed above) to pass and to block portions of the primary light (e.g., blue light, UV light, or blue light combined with UV light) that are not absorbed by QD films 136 and down-converted to the secondary light. The unwanted portions of primary light that may have leaked out of QD films 136 can be blocked by absorbing and/or by scattering. Leakage of the unconverted primary light from QD films 136 to display screen 140 can adversely affect the color gamut coverage of LCD display device 100. The use of light blocking elements 138 to prevent such leakage may also help to reduce the manufacturing cost of LCD display device 100 by reducing the density of luminescent nanostructures included in QD films 136. The density of luminescent nanostructures may be reduced as instead of using the luminescent nanostructures to absorb substantially all portions of the primary light, any portions of primary light not absorbed in QD films 136 can be filtered out by light blocking elements 138. In some embodiments, the density of the luminescent nanostructures in QD films 136 can be further reduced by using UV LEDs mixed with blue LEDs, since more of the UV light is absorbed by the luminescent nanostructures and converted to secondary light as compared to the absorption of blue light by the luminescent nanostructures.

Light blocking elements 138 can be also configured to tune the spectral emission widths (also referred as width of emission spectrum) of the secondary light (e.g., first, second, and/or third secondary light discussed above) to achieve a desired color gamut coverage of LCD display device 100. Tuning of the spectral emission widths may require absorbing one or more wavelengths from the secondary light to narrow their spectral emission widths to achieve the desired color gamut coverage without significant decrease in brightness. For example, there may be less than 10% (e.g., about 8%, about 5%, about 3%, or about 1%) decrease in brightness due to this tuning process compared to display devices without light blocking elements 138. As the secondary light from QD films 136 having luminescent nanostructures such as QDs typically exhibit narrow spectral emission widths, the tuning process may not require absorption of wide range of wavelengths to achieve the desired color gamut coverage as required in current non-QD based display devices to achieve similar color gamut coverage.

When using only blue LEDs for LEDs 110, the blue light emitted from blue sub-pixels 126.3 and 126.6 has a higher overall radiance than the emitted red or green light from the other sub-pixels making color balancing more difficult due to the higher portion of blue light. By replacing some of the blue LEDs with UV LEDs in LEDs 110, the total blue radiance is decreased, while the UV light can be easily filtered, leading to better color balancing. In some embodiments, the ratio of UV LEDs to blue LEDs is chosen such that the blue light output from blue sub-pixels 126.3 and 126.6 is optimized to have a radiance about equal with both the radiance of the red light output from red sub-pixels 126.1 and 126.4 and the radiance of the green light output from green sub-pixels 126.2 and 126.5.

Wide spectral emission width is one of the limitations in current non-QD based display devices (e.g., YAG-phosphor based display devices) in achieving wide color gamut coverage of, for example, the Rec. 2020 color space. Use of absorbing elements such as light blocking elements 138 in current non-QD based display devices may achieve wide color gamut coverage (e.g., 80-90% Rec. 2020 color gamut coverage), but at the cost of significant decrease in brightness. Such decrease in brightness may not only adversely affect the image quality of the current display devices, but also fail to meet the brightness level required under the HDR imaging standards.

Light blocking elements 138 can include one or more non-phosphor materials. That is, the one or more non-phosphor materials exhibit optical absorption properties and/or optical scattering properties, but do not exhibit optical emission properties. The one or more non-phosphor materials may be selected based on their optical absorption properties to absorb and/or on their scattering properties to scatter only the one or more wavelengths or range of wavelengths that require absorbing and/or scattering during the above described blocking and tuning processes. In some embodiments, the one or more non-phosphor materials may include the same absorption property. In some embodiment, each of the one or more non-phosphor materials includes an absorption property different from each other.

The one or more non-phosphor materials may be selected such that they may be inexpensively disposed on QD films 136 or any other layer/structure of LCD display device 100 to form light blocking elements 138. For example, the one or more non-phosphor materials may be dye (e.g., narrow band organic Exciton P491 dye), ink, paint, polymeric material, an/or any material that may be sprayed, painted, spin-coated, printed, or any other suitable low temperature (e.g., below 100° C.) deposition method. Printing may be done using, for example, a plotter, an inkjet printer, or a screen printer. In some embodiments, the one or more non-phosphor materials may be directly disposed on phosphor films 138. In some embodiments, the one or more non-phosphor materials may be scattering materials that include films or particles (e.g., particles having diameters ranging from about 100 nm to about 500 μm) of titanium oxide, zinc oxide, zinc sulfide, silicone, or a combination thereof. In some embodiments, light blocking elements 138 may include a substrate having the one or more non-phosphor materials disposed on it.

In some embodiments, light blocking elements 138 can be segmented films that are placed adjacent to each other on QD films 136 or on an optically transparent substrate (not shown). The segmented light blocking elements 138 can be placed in a manner such that there is negligible gap at interfaces between adjacent light blocking elements 138. In alternate embodiments, each of light blocking elements 138 can be different regions of a continuous film placed on QD films 136. Thus, FIG. 1 is not depicted to scale.

In some embodiments, light blocking elements 138 may not be a separate structure as shown in FIG. 1, but can be included in QD films 136. That is, QD films 136 can be a composite film comprising the luminescent nanostructures, as described above, along with light blocking elements 138. The one or more non-phosphor materials of light blocking elements 138 such as dye, ink, paint, polymeric material, scattering materials (e.g., particles having diameters ranging from about 100 nm to about 500 μm), or a combination thereof may be incorporated or embedded in a matrix of QD films 136. The one or more non-phosphor materials may include nanostructured materials that may be dispersed in a matrix of QD films 136. These nanostructured materials may exhibit optical absorption properties and/or optical scattering properties and may not exhibit any optical emission properties. In some embodiments, light blocking elements 138 can be included in optically transparent substrate 128, which may also be configured to provide environmental sealing to the underlying layers and/or structures of LCD module 104 and/or BLU 102. In alternate embodiments, light blocking elements 138 can be included in second polarizing filter 122, which may be positioned between substrate 128 and QD films 136. In some embodiments, light blocking elements 138 can be dichroic filters that, for example, may reflect the primary light (e.g., blue light, UV light, or combination of UV light and blue light) while transmitting the secondary light. Light blocking elements 138 can include specific UV light filtering components to remove any unconverted UV light from the red and green sub-pixels, and/or the UV light from the blue sub-pixels.

In some embodiments, an optical film 130 can be configured to exhibit brightness enhancement and other optical enhancement properties. In some embodiments, optical film 130 can include one or more lens films, prism films, lenticular films, micro-lens (or micro-sphere) films, and/or other optical enhancement films. Optical film 130 can be configured to direct or redirect light emitting from the BLU 102. For example, if optical film 130 includes a prism film, light may be directed off-axis when passing through an optical feature of one or more of the films described above (e.g., such as a prism). In such manner, optical film 130 can enhance the luminance or brightness of light passing through to the display 140. Likewise, optical film 130 can be configured using different types or combinations of features to minimize mura (i.e., unevenness), enhance light diffusion, and/or to further enhance optical properties of the display. Furthermore, although one optical film 130 is illustrated, additional optical films may be included, stacked or otherwise, to vary the optical characteristics to be enhanced and/or magnitude of the enhancement.

Display screen 140 can be configured to generate images. Display screen 140 can be a touch screen display, according to an embodiment. LCD display device 100 can further include one or more medium materials (not shown) disposed between any of the adjacent elements in LCD display device 100, for example between optical cavity 112 and LCD module 104, on either sides of LC solution layer 120, or between any other elements of LCD display device 100. The one or more medium materials may include, but not limited to, substrates, a vacuum, air, gas, optical materials, adhesives, optical adhesives, glass, polymers, solids, liquids, gels, cured materials, optical coupling materials, index-matching or index-mismatching materials, index-gradient materials, cladding or anti-cladding materials, spacers, epoxy, silica gel, silicones, brightness-enhancing materials, scattering or diffuser materials, reflective or anti-reflective materials, wavelength-selective materials, wavelength-selective anti-reflective materials, or other suitable medium material. Suitable materials may include silicones, silicone gels, silica gel, epoxies (e.g., Loctite™ Epoxy E-30CL), acrylates (e.g., 3M™ Adhesive 2175). The one or more medium materials may be applied as a curable gel or liquid and cured during or after deposition, or pre-formed and pre-cured prior to deposition. Curing methods may include UV curing, thermal curing, chemical curing, or other suitable curing methods known in the art. Index-matching medium materials may be chosen to minimize optical losses between elements of BLU 102 and LCD module 104.

LCD display device 100 can have a geometric shape, such as but not limited to cylindrical, trapezoidal, spherical, or elliptical, according to various embodiments, without departing from the spirit and scope of the present invention. LCD display device 100 is not restricted to being cuboid in shape or having other straight-sided shapes. It should be noted that the rectangular cross-sectional shape of LCD display device 100 is for illustrative purposes, and is not limiting. LCD display device 100 can have other cross-sectional shapes (e.g., trapezoid, oblong, rhomboid), according to various embodiments, without departing from the spirit and scope of the present invention. It should also be noted that even though optical cavity 112, substrates 116 and 128, optical film 130, polarizing filter 114 and 122, and display screen 140 are shown in FIG. 1 to have similar dimensions along X-axis, a person skilled in the art would understand that each of these components may have dimensions different from each other in one or more directions, according to various embodiments.

Figure 2:
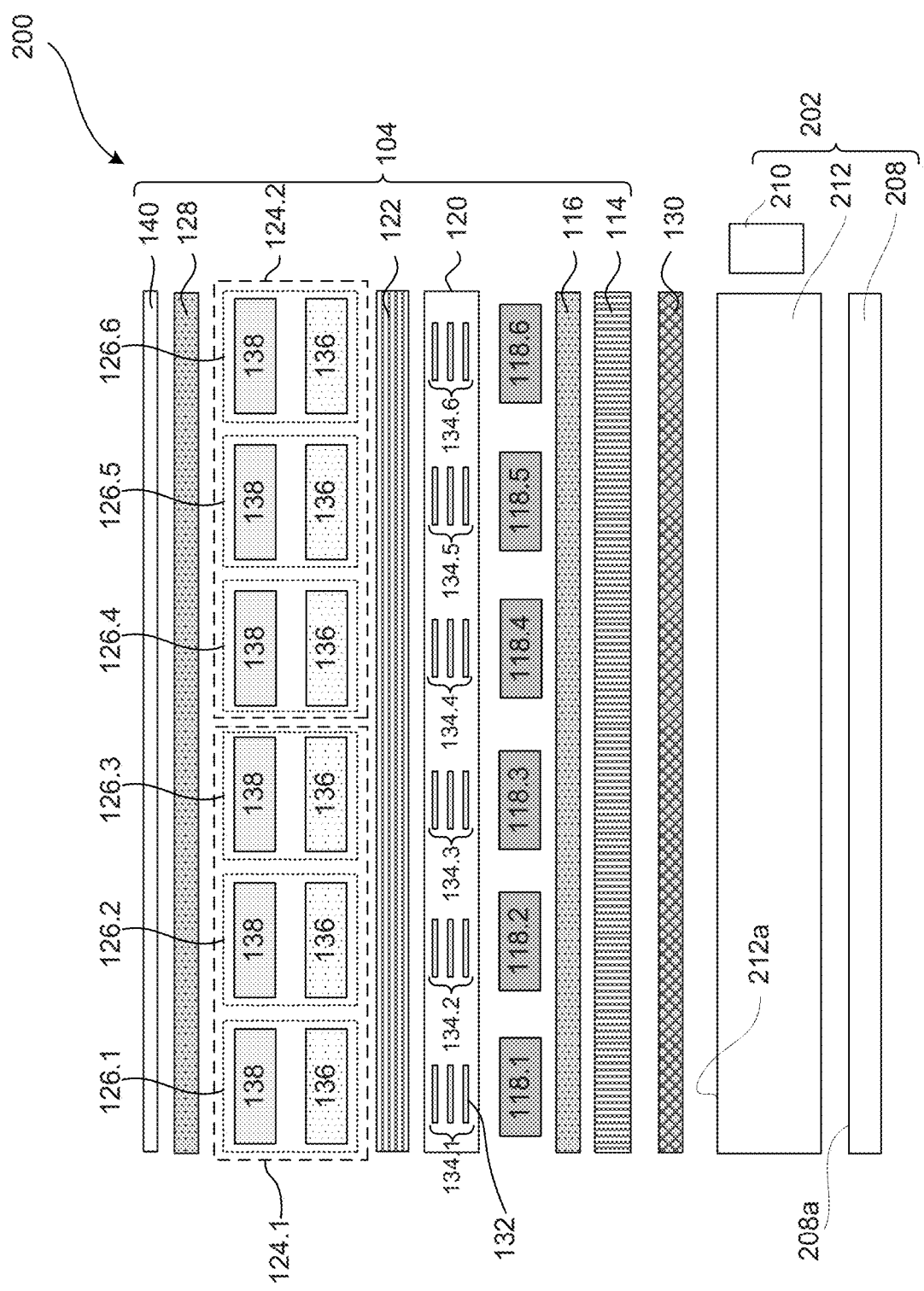

FIG. 2 illustrates a schematic of an exploded cross-sectional view of an edge-lit LCD display device 200, according to an embodiment. LCD display device 200 can include a BLU 202 and LCD module 104. Elements in FIG. 2 with the same annotations as elements in FIG. 1 are described above.

BLU 202 can include an edge-array of LEDs 210 (e.g., blue LEDs, white LEDs, UV LEDs, or a combination of blue and UV LEDs), a light guide plate (LGP) 212, and a reflector 208. BLU 202 can be configured to provide a primary light (e.g., blue light, white light, UV light, or a combination of blue light and UV light) that may be processed through LCD module 104 and subsequently, transmitted to and distributed across display screen 140. In some embodiments, LEDs 210 comprise blue LEDs that emit light having a peak emission wavelength between about 440 nm and about 470 nm, or between about 445 nm and about 455 nm. In some embodiments, LEDs 210 comprise white LEDs that emit light in the range from about 440 nm to about 700 nm or other possible light wavelength ranges. In some embodiments, LEDs 210 comprise UV LEDs that emit light having a peak emission wavelength that is less than 420 nm, or that is between about 400 nm and about 410 nm, or that is between about 360 nm and about 370 nm. According to an embodiment, the blue LED may be, for example, a GaN LED that emits blue light at a wavelength of 450 nm. LEDs 220 can be arranged in line that extends along, for example, the Y-axis.

LGP 212 can include fiber optic cables, polymeric or glass solid bodies such as plates, films, containers, or other structures, according to some embodiments. The size of LGP 212 can depend on the ultimate application and characteristics of LED 210. The thickness of LGP 212 can be compatible with thickness of LED 210. The other dimensions of LGP 212 can be designed to extend beyond the dimensions of LED 210, and may be on the order of 10's of millimeters, to 10's to 100's of centimeters.

In some embodiments, the materials of LGP 212 can include polycarbonate (PC), poly methyl methacrylate (PMMA), methyl methacrylate, styrene, acrylic polymer resin, glass, or other suitable LGP materials. Suitable manufacturing methods for LGP 212 can include injection molding, extrusion, or other suitable embodiments. LGP 212 can be configured to provide uniform primary light emission, such that primary light entering LCD module 104 can be of uniform color and brightness. LGP 212 can include a substantially uniform thickness over the entire LGP 212 surface. Alternatively, LGP 212 can have a wedge-like shape. In some embodiments, LGP 212 can be optically coupled to LED 210 and can be physically connected to or detached from LED 210. For physically connecting LGP 212 to LED 210, optically transparent adhesive may be used (not shown).

In some embodiments, BLU 202 can include an array of LEDs (not shown), each of which may be similar to LED 210 in structure and function. The array of LEDs may be adjacent to LGP 212 and can be configured to provide the primary light to LCD module 104 for processing and for subsequent transmission to display screen 140 as discussed above with reference to FIG. 1.

In some embodiments, reflector 208 can be configured to increase the amount of light that is emitted from LGP 212. Reflector 208 can comprise a suitable material, such as a reflective mirror, a film of reflector particles, a reflective metal film, or other suitable conventional reflectors. In some embodiments, reflector 208 can include a white film. In some embodiments, reflector 208 can include additional functionality or features, such as scattering, diffuser, or brightness-enhancing features.

Example Embodiments of a Quantum Dot on Glass LCD Device

Figure 3:
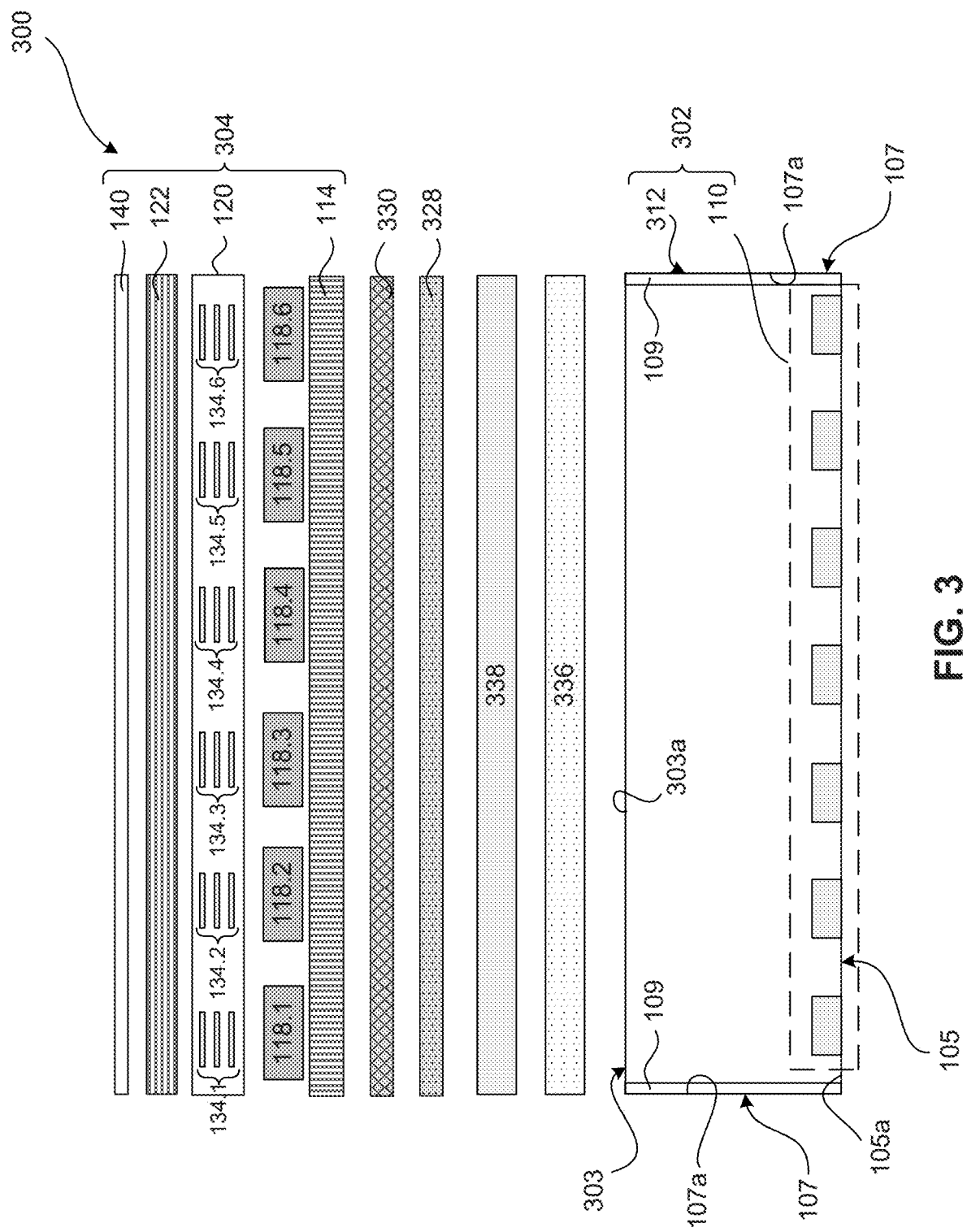
FIG. 3 is an exploded cross-sectional view of a liquid crystal display (LCD) devices, according to an embodiment.

FIG. 3 illustrates a schematic of an exploded cross-sectional view of a direct-lit quantum dot on glass (QDOG) LCD display device 300, according to an embodiment. LCD display device 300 can include a BLU 302, an LCD module 304 and a QD film 336 formed directly on BLU 302, without necessitating an intermediate substrate or barrier layer. In some embodiments, QD film 336 can be a thin film. In some embodiments, QD film 336 can have a thickness of 500 μm or less, preferably 100 μm or less, more preferably 50 μm or less. Most preferably QD film 336 may be a thin film having a thickness of about 15 μm or less. Therefore, display device 300 can achieve a reduced device thickness.

BLU 302 can include an optical cavity 312, at least a top side 303 having a surface 303a comprising glass. Glass provides excellent resistance to impurities including moisture and air. Moreover, glass may be formed as a thin substrate while maintaining structural rigidity. Therefore, optical cavity 312 can be formed at least partially of a glass surface to provide a substrate having sufficient barrier and structural properties.

Figure 4:
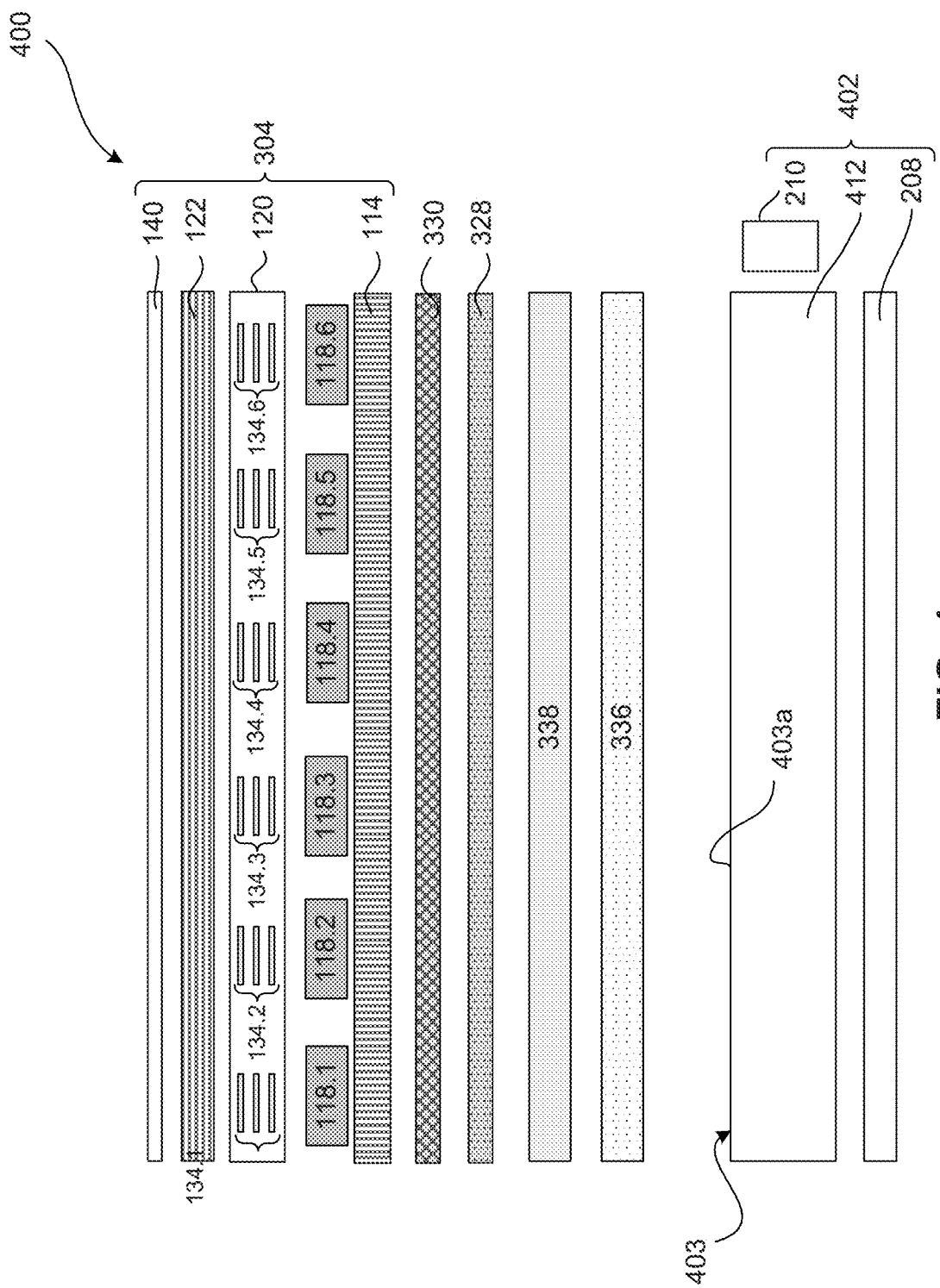
FIG. 4 is an exploded cross-sectional view of a liquid crystal display (LCD) devices, according to an embodiment.

FIG. 4 similarly illustrates a schematic of an exploded cross-sectional view of an edge-lit quantum dot on glass (QDOG) LCD display device 400, according to an embodiment. LCD display device 400 can include QD film 336 formed directly on an LGP 412 of BLU 402, without necessitating an intermediate substrate or barrier layer. Like display device 300 above, in some embodiments QD film 336 can be a thin film such that display device 400 can achieve a reduced device thickness. LGP 412 can include one or more sides, including at least a top side 403 having a top surface 403a comprising glass. Therefore, LGP 412 can be formed at least partially of a glass surface to provide a substrate having sufficient barrier and structural properties.

Elements in FIGS. 3 and 4 with the same annotations as elements in FIG. 1 or 2 are described above. As described in more detail below, QD film 336 may comprise a population of QDs embedded in a matrix material, such as a resin. QD film 336 can be formed on optical cavity 312 (FIG. 3) or LGP 412 (FIG. 4) by any method known in the art. Such methods can include wet coating, painting, spin coating, screen printing, or the like. After deposition, a resin of QD film 336 can be cured. As described below, in some embodiments a resin of one or more QD films 336 can be partially cured, further processed and then finally cured. The QD film can be deposited as one layer or as separate layers, and the separate layers may comprise varying properties, as explained in more detail below. The width and height of the QDs can be any desired dimensions, depending on the size of the viewing panel of the display device. For example, the QD film may have a relatively small surface area in small display device embodiments such as watches and phones, or the QD film may have a large surface area for large display device embodiments such as TVs and computer monitors. Methods for forming the QD BLUs of the present invention can include forming a large QD film and cutting the QD film into smaller QD films to form individual lighting devices.

In some embodiments of the present invention, the matrix material in which the QDs are embedded can be comprised of other layers of the BLU, such as one or more of the optical cavity, LGP, barrier layers, BEFs, diffuser layers, or other suitable layers of the BLU, such that the QDs are embedded therein, whereby at least a portion of the primary light transmitted therethrough is absorbed by the QDs and down-converted to secondary light emitted by the QDs.

An optically transparent substrate 328 can be formed on QD film 336 by any method known in the art, such as vacuum deposition, vapor deposition or the like. As above, optically transparent substrate may be configured to provide environmental sealing to the underlying layers and/or structures of QD film 336 and/or the BLU.

An optical film 330 can be formed over optically transparent substrate 328 and configured to exhibit brightness enhancement and other optical enhancement properties. Optical film 330 can include prisms, pitches, grooves, or other suitable brightness enhancement features, one or more reflective and/or refractive films, reflective polarizer films, light extraction features, light recycling features, lens films, prism films, groove films, grooved prism films, lenticular films, micro-lens (or micro-sphere) films, and/or other optical enhancement films. Optical film 330 can be configured to direct or redirect light emitting from the BLU 302. For example, if optical film 330 includes a prism film, light may be directed off-axis when passing through an optical feature of one or more of the films described above (e.g., such as a prism). In such manner, optical film 330 can enhance the luminance or brightness of light passing through to the display 140. Likewise, optical film 330 can be configured using different types or combinations of features to minimize mura (i.e., unevenness), enhance light diffusion, and/or to further enhance properties of the display. Optical film 330 may be configured, for example, to reflect a portion of the primary light (e.g., blue and UV light from optical cavity 312) back toward optical cavity 312, thereby providing recycling of the primary light. Furthermore, although one optical film 330 is illustrated, additional optical films may be included, stacked or otherwise, to vary the optical characteristics to be enhanced and/or magnitude of the enhancement.

In some embodiments, light blocking elements 338 can be included in the optically transparent substrate 328. In alternate embodiments, light blocking elements 338 can be included in second polarizing filter 122, which may be positioned between substrate 328 and QD film 336. In some embodiments, light blocking elements 338 can be dichroic filters that, for example, may reflect the primary light (e.g., blue light, UV light, or combination of UV light and blue light) while transmitting the secondary light. Light blocking elements 338 can include specific UV light filtering components to remove any unconverted UV light from the red and green sub-pixels, and/or the UV light from the blue sub-pixels.

Example Embodiments of a Barrier Layer Coated Nanostructure

Figure 5:
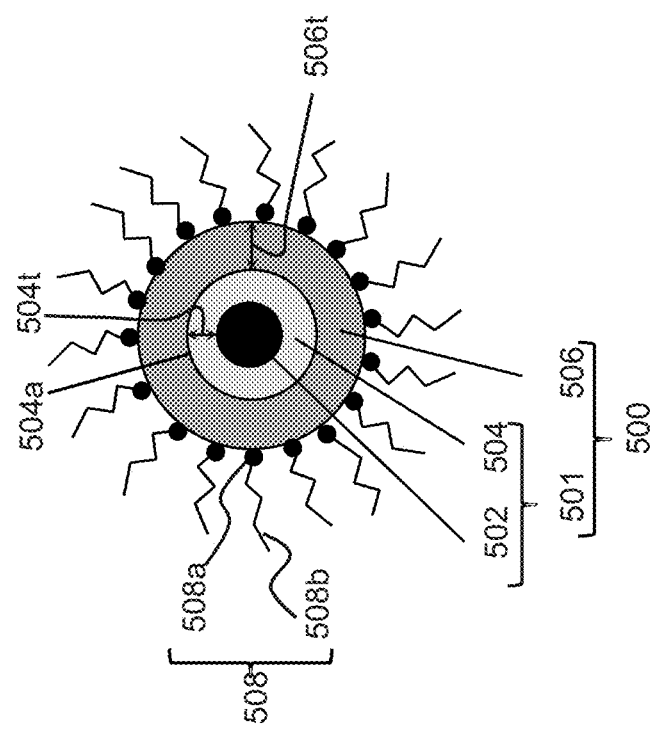
FIG. 5 is a schematic of a cross-sectional view of a quantum dot, according to an embodiment.

FIG. 5 illustrates a cross-sectional structure of a barrier layer coated luminescent nanostructure (NS) 500, according to an embodiment. In some embodiments, a population of NS 500 can be included in QD films (which may correspond to QD films 136, 236, 336, etc., of the disclosed embodiments). Barrier layer coated NS 500 includes a NS 501 and a barrier layer 506. NS 501 includes a core 502 and a shell 504. Core 502 includes a semiconducting material that emits light upon absorption of higher energies. Examples of the semiconducting material for core 502 include indium phosphide (InP), cadmium selenide (CdSe), zinc sulfide (ZnS), lead sulfide (PbS), indium arsenide (InAs), indium gallium phosphide, (InGaP), cadmium zinc selenide (CdZnSe), zinc selenide (ZnSe) and cadmium telluride (CdTe). Any other II-VI, III-V, tertiary, or quaternary semiconductor structures that exhibit a direct band gap may be used as well. In an embodiment, core 502 can also include one or more dopants such as metals, alloys, to provide some examples. Examples of metal dopant may include, but not limited to, zinc (Zn), Copper (Cu), aluminum (Al), platinum (Pt), chrome (Cr), tungsten (W), palladium (Pd), or a combination thereof. The presence of one or more dopants in core 502 can improve structural and optical stability and QY of NS 501 compared to undoped NSs.

Core 502 can have a size of less than 20 nm in diameter, according to an embodiment. In another embodiment, core 502 can have a size between about 1 nm and about 5 nm in diameter. The ability to tailor the size of core 502, and consequently the size of NS 501 in the nanometer range enables photoemission coverage in the entire visible spectrum. In general, the larger NSs emit light towards the red end of the spectrum, while smaller NSs emit light towards the blue end of the spectrum. This effect arises as larger NSs have energy levels that are more closely spaced than the smaller NSs. This allows the NS to absorb photons containing less energy, i.e. those closer to the red end of the spectrum.

Shell 504 surrounds core 502 and is disposed on outer surface of core 502. Shell 504 can include cadmium sulfide (CdS), zinc cadmium sulfide (ZnCdS), zinc selenide sulfide (ZnSeS), and zinc sulfide (ZnS). In an embodiment, shell 504 can have a thickness 504t, for example, of one or more monolayers. In other embodiments, shell 504 can have a thickness 504t between about 1 nm and about 5 nm. Shell 504 can be utilized to help reduce the lattice mismatch with core 502 and improve the QY of NS 501. Shell 504 can also help to passivate and remove surface trap states, such as dangling bonds, on core 502 to increase QY of NS 501. The presence of surface trap states may provide non-radiative recombination centers and contribute to lowered emission efficiency of NS 501.

In alternate embodiments, NS 501 can include a second shell disposed on shell 504, or more than two shells surrounding core 502, without departing from the spirit and scope of the present invention. In an embodiment, the second shell may be on the order of two monolayers thick and is typically, though not required, also a semiconducting material. Second shell may provide protection to core 502. Second shell material may be zinc sulfide (ZnS), although other materials may be used as well without deviating from the scope or spirit of the invention.

Barrier layer 506 is configured to form a coating on NS 501. In an embodiment, barrier layer 506 is disposed on and in substantial contact with outer surface 504a of shell 504. In embodiments of NS 501 having one or more shells, barrier layer 506 can be disposed on and in substantial contact with the outermost shell of NS 501. In an example embodiment, barrier layer 506 is configured to act as a spacer between NS 501 and one or more NSs in, for example, a solution, a composition, and/or a film having a plurality of NSs, where the plurality of NSs may be similar to NS 501 and/or barrier layer coated NS 500. In such NS solutions, NS compositions, and/or NS films, barrier layer 506 can help to prevent aggregation of NS 501 with adjacent NSs. Aggregation of NS 501 with adjacent NSs may lead to increase in size of NS 501 and consequent reduction or quenching in the optical emission properties of the aggregated NS (not shown) including NS 501. In further embodiments, barrier layer 506 provides protection to NS 501 from, for example, moisture, air, and/or harsh environments (e.g., high temperatures and chemicals used during lithographic processing of NSs and/or during manufacturing process of NS based devices) that may adversely affect the structural and optical properties of NS 501.

Barrier layer 506 includes one or more materials that are amorphous, optically transparent and/or electrically inactive. Suitable barrier layers include inorganic materials, such as, but not limited to, inorganic oxides and/or nitrides. Examples of materials for barrier layer 506 include oxides and/or nitrides of Al, Ba, Ca, Mg, Ni, Si, Ti, or Zr, according to various embodiments. Barrier layer 506 can have a thickness 506t ranging from about 8 nm to about 15 nm in various embodiments.

As illustrated in FIG. 5, barrier layer coated NS 500 can additionally or optionally include a plurality of ligands or surfactants 508, according to an embodiment. Ligands or surfactants 508 can be adsorbed or bound to an outer surface of barrier layer coated NS 500, such as on an outer surface of barrier layer 506, according to an embodiment. The plurality of ligands or surfactants 508 can include hydrophilic or polar heads 508a and hydrophobic or non-polar tails 508b. The hydrophilic or polar heads 508a can be bound to barrier layer 506. The presence of ligands or surfactants 508 can help to separate NS 500 and/or NS 501 from other NSs in, for example, a solution, a composition, and/or a film during their formation. If the NSs are allowed to aggregate during their formation, the quantum efficiency of NSs such as NS 500 and/or NS 501 can drop. Ligands or surfactants 508 can also be used to impart certain properties to barrier layer coated NS 500, such as hydrophobicity to provide miscibility in non-polar solvents, or to provide reaction sites (e.g., reverse micellar systems) for other compounds to bind.

A wide variety of ligands exist that may be used as ligands 508. In some embodiments, the ligand is a fatty acid selected from lauric acid, caproic acid, myristic acid, palmitic acid, stearic acid, and oleic acid. In some embodiments, the ligand is an organic phosphine or an organic phosphine oxide selected from trioctylphosphine oxide (TOPO), trioctylphosphine (TOP), diphenylphosphine (DPP), triphenylphosphine oxide, and tributylphosphine oxide. In some embodiments, the ligand is an amine selected from dodecylamine, oleylamine, hexadecylamine, and octadecylamine. In some embodiments, the ligand is trioctylphosphine (TOP). In some embodiments, the ligand is oleylamine. In some embodiments, the ligand is diphenylphosphine.

A wide variety of surfactants exist that may be used as surfactants 508. Nonionic surfactants may be used as surfactants 508 in some embodiments. Some examples of nonionic surfactants include polyoxyethylene (5) nonylphenylether (commercial name IGEPAL CO-520), polyoxyethylene (9) nonylphenylether (IGEPAL CO-630), octylphenoxy poly(ethyleneoxy)ethanol (IGEPAL CA-630), polyethylene glycol oleyl ether (Brij 93), polyethylene glycol hexadecyl ether (Brij 52), polyethylene glycol octadecyl ether (Brij S10), polyoxyethylene (10) isooctylcyclohexyl ether (Triton X-100), and polyoxyethylene branched nonylcyclohexyl ether (Triton N-101).

Anionic surfactants may be used as surfactants 508 in some embodiments. Some examples of anionic surfactants include sodium dioctyl sulfosuccinate, sodium stearate, sodium lauryl sulfate, sodium monododecyl phosphate, sodium dodecylbenzenesulfonate, and sodium myristyl sulfate.

In some embodiments, NSs 501 and/or 500 can be synthesized to emit light in one or more various color ranges, such as red, orange, and/or yellow range. In some embodiments, NSs 501 and/or 500 can be synthesized to emit light in the green and/or yellow range. In some embodiments, NSs 501 and/or 500 can be synthesized emit light in the blue, indigo, violet, and/or ultra-violet range. In some embodiments, NSs 501 and/or 500 can be synthesized to have a primary emission peak wavelength between about 505 nm and about 650 nm, between about 510 nm and about 550 nm, or between about 300 nm and about 480 nm.

NSs 501 and/or 500 can be synthesized to display a high QY. In some embodiments, NSs 501 and/or 500 can be synthesized to display a QY between 80% and 95% or between 85% and 90%.

Thus, according to various embodiments, NSs 500 can be synthesized such that the presence of barrier layer 506 on NSs 501 does not substantially change or quench the optical emission properties of NSs 501.

Example Embodiments of a Nanostructure Film

Figure 6:
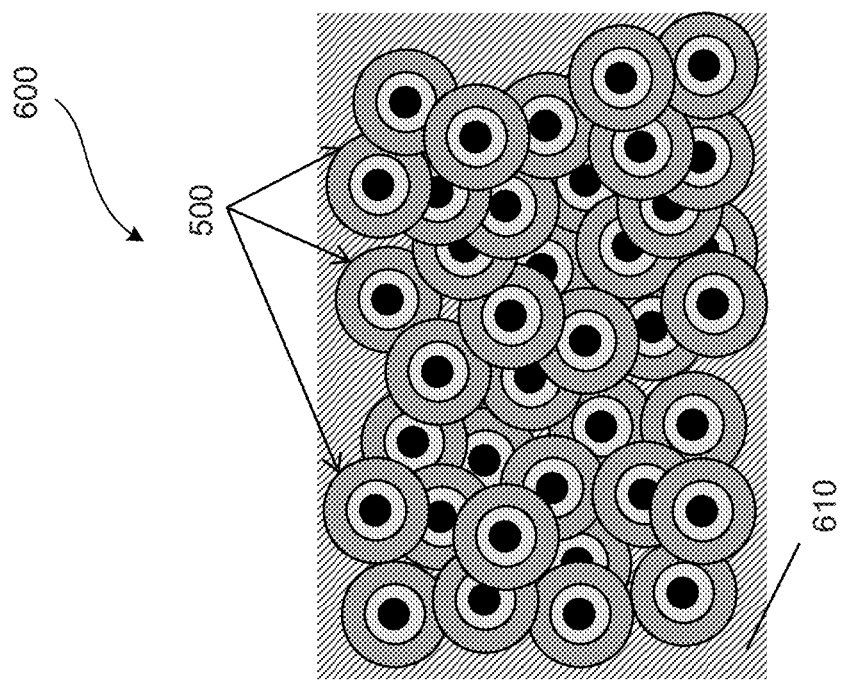
FIG. 6 is a schematic of a quantum dot film, according to an embodiment.

FIG. 6 illustrates a cross-sectional view of a NS film 600, according to an embodiment. QD films according to some embodiments can be similar to NS film 600.

NS film 600 can include a plurality of barrier layer coated core-shell NSs 500 (FIG. 5) and a matrix material 610, according to an embodiment. NSs 500 can be embedded or otherwise disposed in matrix material 610, according to some embodiments. As used herein, the term "embedded" is used to indicate that the NSs are enclosed or encased within matrix material 610 that makes up the majority component of the matrix. It should be noted that NSs 500 can be uniformly distributed throughout matrix material 610 in an embodiment, though in other embodiments NSs 500 can be distributed according to an application-specific uniformity distribution function. It should be noted that even though NSs 500 are shown to have the same size in diameter, a person skilled in the art would understand that NSs 500 can have a size distribution.

In an embodiment, NSs 500 can include a homogenous population of NSs having sizes that emit in the blue visible wavelength spectrum, in the green visible wavelength spectrum, or in the red visible wavelength spectrum. In other embodiments, NSs 500 can include a first population of NSs having sizes that emit in the blue visible wavelength spectrum, a second population of NSs having sizes that emit in the green visible wavelength spectrum, and a third population of NSs that emit in the red visible wavelength spectrum.

Matrix material 610 can be any suitable host matrix material capable of housing NSs 500. Suitable matrix materials may be chemically and optically compatible with NSs 500 and any surrounding packaging materials or layers used in applying NS film 600 to devices. Suitable matrix materials may include non-yellowing optical materials that are transparent to both the primary and secondary light, thereby allowing for both primary and secondary light to transmit through the matrix material. In an embodiment, matrix material 610 can completely surround each of the NSs 500. The matrix material 610 can be flexible in applications where a flexible or moldable NS film 600 is desired. Alternatively, matrix material 610 can include a high-strength, non-flexible material.

Matrix material 610 can include polymers and organic and inorganic oxides. Suitable polymers for use in matrix material 610 can be any polymer known to the ordinarily skilled artisan that can be used for such a purpose. The polymer may be substantially translucent or substantially transparent. Matrix material 610 can include, but not limited to, epoxies, acrylates, norbornene, polyethylene, poly(vinyl butyral):poly(vinyl acetate), polyurea, polyurethanes; silicones and silicone derivatives including, but not limited to, amino silicone (AMS), polyphenylmethylsiloxane, polyphenylalkylsiloxane, polydiphenylsiloxane, polydialkylsiloxane, silsesquioxanes, fluorinated silicones, and vinyl and hydride substituted silicones; acrylic polymers and copolymers formed from monomers including, but not limited to, methylmethacrylate, butylmethacrylate, and laurylmethacrylate; styrene-based polymers such as polystyrene, amino polystyrene (APS), and poly(acrylonitrile ethylene styrene) (AES); polymers that are crosslinked with bifunctional monomers, such as divinylbenzene; cross-linkers suitable for cross-linking ligand materials, epoxides that combine with ligand amines (e.g., APS or PEI ligand amines) to form epoxy, and the like.

In some embodiments, matrix material 610 includes scattering microbeads such as $TiO_2$ microbeads, ZnS microbeads, or glass microbeads that may improve photo conversion efficiency of NS film 600. In some embodiments, matrix material 610 can include light blocking elements such as light blocking elements 138 and/or 338 described above with reference to FIGS. 1-4.

In another embodiment, matrix material 610 can have low oxygen and moisture permeability, exhibit high photo- and chemical-stability, exhibit favorable refractive indices, and adhere to outer surfaces of NSs 500, thus providing an air-tight seal to protect NSs 500. In another embodiment, matrix material 610 can be curable with UV or thermal curing methods to facilitate roll-to-roll processing.

According to some embodiments, NS film 600 can be formed by mixing NSs 500 in a polymer (e.g., photoresist) and casting the NS-polymer mixture on a substrate, mixing NSs 500 with monomers and polymerizing them together, mixing NSs 500 in a sol-gel to form an oxide, or any other method known to those skilled in the art.

According to some embodiments, the formation of NS film 600 can include a film extrusion process. The film extrusion process may include forming a homogenous mixture of matrix material 610 and barrier layer coated core-shell NSs such as NS 500, introducing the homogenous mixture into a top mounted hopper that feeds into an extruder. In some embodiments, the homogenous mixture may be in the form of pellets. The film extrusion process may further include extruding NS film 600 from a slot die and passing extruded NS film 600 through chill rolls. In some embodiments, the extruded NS film 600 can have a thickness less than about 75 μm, for example, in a range from about 70 μm to about 40 μm, from about 65 μm to about 40 μm, from about 60 μm to about 40 μm, or form about 50 μm to about 40 μm. In some embodiments, NS film 600 has a thickness less than about 10 μm. In some embodiments, the formation of NS film 600 can optionally include a secondary process followed by the film extrusion process. The secondary process may include a process such as co-extrusion, thermoforming, vacuum forming, plasma treatment, molding, and/or embossing to provide a texture to a top surface of NS film 600. The textured top surface NS film 600 can help to improve, for example defined optical diffusion property and/or defined angular optical emission property of NS film 600.

Example Embodiments of Luminescent Nanostructures

Described herein are various compositions having luminescent nanostructures (NSs). The various properties of the luminescent nanostructures, including their absorption properties, emission properties and refractive index properties, may be tailored and adjusted for various applications.

The material properties of NSs may be substantially homogenous, or in some embodiments, may be heterogeneous. The optical properties of NSs may be determined by their particle size, chemical or surface composition. The ability to tailor the luminescent NS size in the range between about 1 nm and about 15 nm may enable photoemission coverage in the entire visible spectrum to offer great versatility in color rendering. Particle encapsulation may offer robustness against chemical and UV deteriorating agents.

Luminescent NSs, for use in embodiments described herein may be produced using any method known to those skilled in the art. Suitable methods and example nanocrystals are disclosed in U.S. Pat. No. 7,374,807; U.S. patent application Ser. No. 10/796,832, filed Mar. 10, 2004; U.S. Pat. No. 6,949,206; and U.S. Provisional Patent Application No. 60/578,236, filed Jun. 8, 2004, the disclosures of each of which are incorporated by reference herein in their entireties.

Luminescent NSs for use in embodiments described herein may be produced from any suitable material, including an inorganic material, and more suitably an inorganic conductive or semiconductive material. Suitable semiconductor materials may include those disclosed in U.S. patent application Ser. No. 10/796,832, and may include any type of semiconductor, including group II-VI, group III-V, group IV-VI and group IV semiconductors. Suitable semiconductor materials may include, but are not limited to, Si, Ge, Sn, Se, Te, B, C (including diamond), P, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SuS, SnSe, SnTe, PbO, PbS, PbSe, PbTe, CuF, CuCl, CuBr, CuI, Si3N4, Ge3N4, Al2O3, (Al, Ga, In)2 (S, Se, Te)3, Al2CO, and an appropriate combination of two or more such semiconductors.

In some embodiments, the luminescent NSs may have a dopant from the group consisting of a p-type dopant or an n-type dopant. The NSs may also have II-VI or III-V semiconductors. Examples of II-VI or III-V semiconductor NSs may include any combination of an element from Group II, such as Zn, Cd and Hg, with any element from Group VI, such as S, Se, Te and Po, of the Periodic Table; and any combination of an element from Group III, such as B, Al, Ga, In, and Tl, with any element from Group V, such as N, P, As, Sb and Bi, of the Periodic Table.

The luminescent NSs, described herein may also further include ligands conjugated, cooperated, associated or attached to their surface. Suitable ligands may include any group known to those skilled in the art, including those disclosed in U.S. Pat. No. 8,283,412; U.S. Patent Publication No. 2008/0237540; U.S. Patent Publication No. 2010/0110728; U.S. Pat. Nos. 8,563,133; 7,645,397; 7,374,807; 6,949,206; 7,572,393; and 7,267,875, the disclosures of each of which are incorporated herein by reference. Use of such ligands may enhance the ability of the luminescent NSs to incorporate into various solvents and matrixes, including polymers. Increasing the miscibility (i.e., the ability to be mixed without separation) of the luminescent NSs in various solvents and matrixes may allow them to be distributed throughout a polymeric composition such that the NSs do not aggregate together and therefore do not scatter light. Such ligands are described as "miscibility-enhancing" ligands herein.

In some embodiments, compositions having luminescent NSs distributed or embedded in a matrix material are provided. Suitable matrix materials may be any material known to the ordinarily skilled artisan, including polymeric materials, organic and inorganic oxides. Compositions described herein may be layers, encapsulants, coatings, sheets or films. It should be understood that in embodiments described herein where reference is made to a layer, polymeric layer, matrix, sheet or film, these terms are used interchangeably, and the embodiment so described is not limited to any one type of composition, but encompasses any matrix material or layer described herein or known in the art.

Down-converting NSs (for example, as disclosed in U.S. Pat. No. 7,374,807) utilize the emission properties of luminescent nanostructures that are tailored to absorb light of a particular wavelength and then emit at a second wavelength, thereby providing enhanced performance and efficiency of active sources (e.g., LEDs).

While any method known to the ordinarily skilled artisan may be used to create luminescent NSs, a solution-phase colloidal method for controlled growth of inorganic nanomaterial phosphors may be used. See Alivisatos, A. P., "Semiconductor clusters, nanocrystals, and quantum dots," Science 271:933 (1996); X. Peng, M. Schlamp, A. Kadavanich, A. P. Alivisatos, "Epitaxial growth of highly luminescent CdSe/CdS Core/Shell nanocrystals with photostability and electronic accessibility," J. Am. Chem. Soc. 30:7019-7029 (1997); and C. B. Murray, D. J. Norris, M. G. Bawendi, "Synthesis and characterization of nearly monodisperse CdE (E=sulfur, selenium, tellurium) semiconductor nanocrystallites," J Am. Chem. Soc. 115:8706 (1993), the disclosures of which are incorporated by reference herein in their entireties.

According to an embodiment, CdSe may be used as the NS material, in one example, for visible light down-conversion, due to the relative maturity of the synthesis of this material. Due to the use of a generic surface chemistry, it may also possible to substitute non-cadmium-containing NSs.

In semiconductor NSs, photo-induced emission arises from the band edge states of the NS. The band-edge emission from luminescent NSs competes with radiative and non-radiative decay channels originating from surface electronic states. X. Peng, et al., J Am. Chem. Soc. 30:7019-7029 (1997). As a result, the presence of surface defects such as dangling bonds provide non-radiative recombination centers and contribute to lowered emission efficiency. An efficient and permanent method to passivate and remove the surface trap states may be to epitaxially grow an inorganic shell material on the surface of the NS. X. Peng, et al., J. Am. Chem. Soc. 30:701 9-7029 (1997). The shell material may be chosen such that the electronic levels are type 1 with respect to the core material (e.g., with a larger bandgap to provide a potential step localizing the electron and hole to the core). As a result, the probability of non-radiative recombination may be reduced.

Core-shell structures may be obtained by adding organometallic precursors containing the shell materials to a reaction mixture containing the core NSs. In this case, rather than a nucleation event followed by growth, the cores act as the nuclei, and the shells may grow from their surface. The temperature of the reaction is kept low to favor the addition of shell material monomers to the core surface, while preventing independent nucleation of nanocrystals of the shell materials. Surfactants in the reaction mixture are present to direct the controlled growth of shell material and to ensure solubility. A uniform and epitaxially grown shell may be obtained when there is a low lattice mismatch between the two materials.

Example materials for preparing core-shell luminescent NSs may include, but are not limited to, Si, Ge, Sn, Se, Te, B, C (including diamond), P, Co, Au, BN, BP, BAs, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTc, BeS, BcSe, BcTe, MgS, MgSe, GeS, GeSe, GeTe, SnS, SnSe, SnTe, PbO, PbS, Pb Se, PbTe, CuP, CuCl, CuBr, CuI, Si3N4, Ge3N4, Al2O3, (Al, Ga, In)2 (S, Se, Te)3, AlCO, and shell luminescent NSs for use in the practice of the present invention include, but are not limited to, (represented as Core/Shell), CdSe/ZnS, InP/ZnS, InP/ZnSe, PbSe/PbS, CdSe/CdS, CdTe/CdS, CdTe/ZnS, as well as others.

Luminescent NSs for use in the embodiments described herein may be less than about 100 nm in size, and down to less than about 2 nm in size and absorb visible light. As used herein, visible light is electromagnetic radiation with wavelengths between about 380 and about 780 nanometers that is visible to the human eye. Visible light can be separated into the various colors of the spectrum, such as red, orange, yellow, green, blue, indigo and violet. Blue light may comprise light between about 435 nm and about 495 nm, green light may comprise light between about 495 nm and 570 nm and red light may comprise light between about 620 nm and about 750 nm in wavelength.

According to various embodiments, the luminescent NSs may have a size and a composition such that they absorb photons that are in the ultraviolet, near-infrared, and/or infrared spectra. The ultraviolet spectrum may comprise light between about 100 nm to about 400 nm, the near-infrared spectrum may comprise light between about 750 nm to about 100 µm in wavelength, and the infrared spectrum may comprise light between about 750 nm to about 300 µm in wavelength.

While luminescent NSs of other suitable material may be used in the various embodiments described herein, in some embodiments, the NSs may be ZnS, InAs, CdSe, or any combination thereof to form a population of nanocrystals for use in the embodiments described herein. As discussed above, in further embodiments, the luminescent NSs may be core/shell nanocrystals, such as CdSe/ZnS, InP/ZnSe, CdSe/CdS or InP/ZnS.

Suitable luminescent nanostructures, methods of preparing luminescent nanostructures, including the addition of various solubility-enhancing ligands, can be found in Published U.S. Patent Publication No. 2012/0113672, the disclosure of which is incorporated by reference herein in its entirety.

Figure 8:
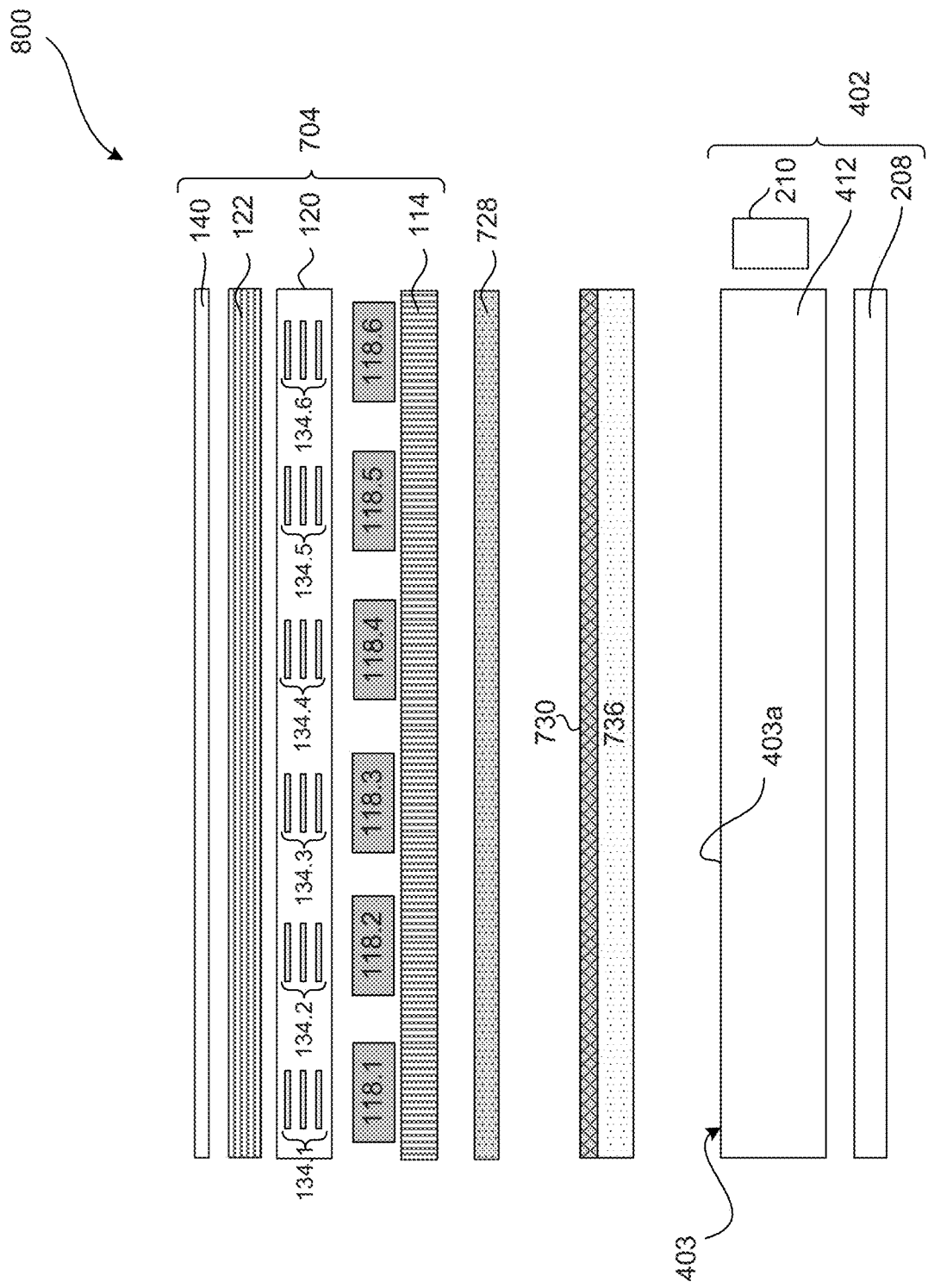
FIG. 8 is an exploded cross-sectional view of a liquid crystal display (LCD) devices, according to an embodiment.

Example Embodiments of Display Device Having a Quantum Dot Film with Integrated Optical Features FIG. 7 illustrates a schematic of an exploded cross-sectional view of a direct-lit display device 700, according to an embodiment. Direct-lit display device 700 can include a BLU 302, an LCD module 704 and a QD film 736 with integrated optical features 730. FIG. 8 illustrates a schematic of an exploded cross-sectional view of an edge-lit display device 800, according to a similar embodiment. Edge-lit display device 800 can include a BLU 402, an LCD module 704 and a QD film 736 with integrated optical features 730. Elements in FIGS. 7 and 8 with the same annotations as elements in FIGS. 1 to 4 are described above.

As described above, the thickness of a display device can be reduced by forming a thin substrate, such as a glass substrate, as part of the BLU and depositing at least a population of thin QD films on the substrate to enable omission of a barrier layer that would otherwise be required. Thus, a single barrier layer, encapsulation film 728, may be disposed on the thin QD films to provide environmental sealing thereto and to provide a protective barrier. While the size of a display device may be reduced by decreasing the thickness of individual elements, there may be a limit on the extent to which such components can be minimized. Therefore, in some embodiments overall device thickness may be further reduced by omitting and/or combining components. In some embodiments of the present invention, the device thickness may be reduced by integrating optical features into the population of thin QD films. That is, by integrating optical features such as luminance enhancement or mura reduction into the QD films, a separate optical film may be omitted.

For example, in a direct-lit display device 700 of FIG. 7 and in an edge-lit display device 800 of FIG. 8, QD film 736 may be formed or processed to include one or more optical enhancement features 730, such as reflective and/or refractive features, prisms, grooves, grooved prisms, lenticular lenses, micro-lenses, micro-spheres, any other lenses, pitches, or other suitable brightness enhancement and/or optical features. Thereby, light emitting from QD film 736 can be enhanced for improved optical properties, such as luminance.

Also, QD film 736 can further comprise light blocking elements (as described in above embodiments) that comprise a UV blocking filter. In some embodiments, one or more optical enhancement features 730 of QD film 736 can have certain optical properties, such as light blocking properties. In some embodiments, because optical enhancement features 730 can include light blocking properties, the amount of light blocking elements may be reduced or omitted while maintaining light blocking capability sufficient to block the portions of the primary light (as mentioned above) that are not absorbed by QD film 736 and down-converted to the secondary light. Therefore, these embodiments may achieve both a reduction in both the density of QDs and light blocking elements.

Figure 9A:
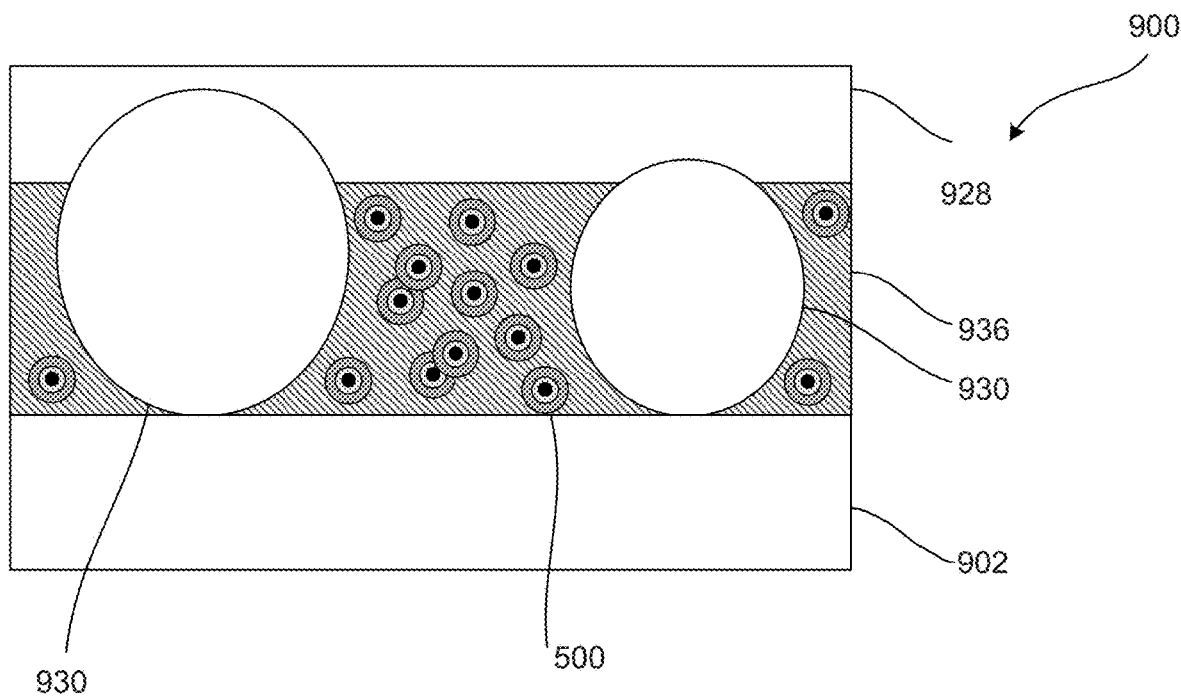
FIGS. 9A and 9B are cross-sectional views of a display device, according to an embodiment.
Figure 9B:
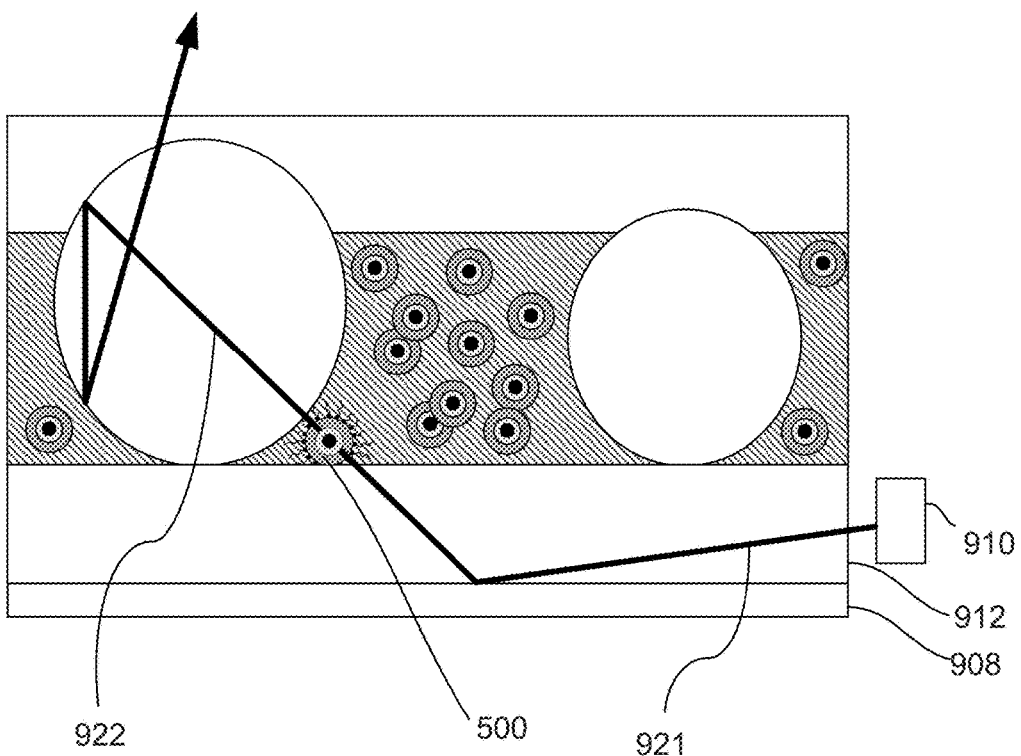

Example Embodiments of Display Device Having a Quantum Dot Film with Integrated Microspheres FIGS. 9A and 9B depict a cross-sectional view of a display device 900, according to an embodiment. Elements shown in other embodiments, such as a liquid crystal module, are omitted herein for better understanding. One of ordinary skill in the art would understand such elements as described above.

In FIG. 9A, a BLU 902 can include a top surface formed of glass or other suitable substrate. QD film 936 can be disposed on the top surface of BLU 902. QD film 936 comprises QDs 500 and microspheres 930 embedded in a matrix material, such as a resin. Microspheres 930 can be disposed to exhibit brightness enhancement and other optical enhancement properties. Microspheres 930 can be an optically transmissive material such as glass, polymer or other suitable material. Polymers may include silicone, polycarbonate, polyester, aromatic polyamide, polyamide-imide, polyimide, and the like. Microspheres 930 can have a size of about 100 µm or less in diameter, according to an embodiment. In another embodiment, microspheres 930 can have a diameter of about 30 µm or less. Moreover, microspheres 930 can have a size that is relative to the intended thickness of the QD film 936. For example, microspheres 930 can have a size that is less than, substantially equal or greater than the thickness of the matrix material. At least one population of microspheres may be distributed having a uniform diameter (not shown) or a non-uniform diameter (as shown in FIGS. 9A and 9B).

The distribution of microspheres may address variations in thickness of coating. Specifically, during the manufacturing process, QD films are generally coated or deposited with consistency to achieve a flat film. However, the uniformity of the QD film 936, even a QD film that has been unevenly coated, may be improved overall based on the distribution of microspheres 930. For example, microspheres having non-uniform diameters, in the range of about 10 µm to about 30 µm, may be disposed in the matrix material. By such distribution, the top surface of the QD film 936 is irregular, reducing any effect of unevenness of coating. Although the top surface of the QD film 936 having embedded microspheres 930 can be irregular at a local scale, at a larger scale the thickness of QD film 936 achieves improved consistency.

The overall QD film 936 having embedded microspheres 930 can be substantially uniform as a result of the irregular microsphere distribution. Thus, in an embodiment, disposing microspheres having irregular size and/or distribution may permit the manufacture of high quality display devices even with inexpensive deposition machinery.

An encapsulation film 928, which can be a thin film encapsulation (TFE) layer, may be disposed on QD film 936 having embedded microspheres 930, to provide environmental sealing to thereto and to provide a protective barrier. Encapsulation film 928 can have a thickness of about 1 µm or less and may be formed of materials as described in above embodiments.

FIG. 9B illustrates light emission in an edge-lit display comprising microspheres, for example. In FIG. 9B, a BLU comprises an edge-array of LEDs 910, LGP 912, and a reflector 908. As above, LGP 912 can include fiber optic cables, polymeric or glass solid bodies such as plates, films, containers, or other structures, according to some embodiments. A top surface of LGP 912 can be formed of glass or other suitable substrate.

Microspheres 930 can produce an optical effect enabling omission of a separate optical film. For example, at least a portion of primary light 921 emitted from LED 910 can be reflected from reflector 908. Primary light 921 can be absorbed by QD 500 and re-emitted as secondary light 922 having a different energy or wavelength than the primary light. The secondary light 922 can enter a microsphere that includes refractive index properties that cause secondary light 922 (and/or other primary or secondary lights) to be refracted and directed off-axis when passing through microspheres 930. As a result, display device 900 that includes at least QD film 936 having a population of embedded microspheres may achieve improved luminance and distribution without a separate optical film.

Furthermore, microspheres 930 can be selected from or formed comprising a material that includes light blocking properties in order to reduce the need for separate light blocking materials. Therefore, in an embodiment the amount of discrete light blocking elements (e.g., corresponding to light blocking elements 138 and the like) may be reduced in QD film 936. FIG. 9B illustrates an edge-lit backlight unit for illustration purposes only, while display devices having other configurations, such as a direct-lit display, may operate similarly and are within the scope of this disclosure.

Method of Manufacturing a Display Device Having a Quantum Dot Film with Integrated Microspheres FIGS. 10A-10D illustrate a method of manufacturing a display device having microspheres 1030 integrated in a QD film 1036, according to one embodiment. The method of FIGS. 10A-10D is described with reference to an edge-lit backlight unit for illustration purposes only. One of ordinary skill in the art would understand a similar method to form a direct-lit display in accordance with this embodiment, with reference to direct-lit backlight units described above.

Figure 10A:
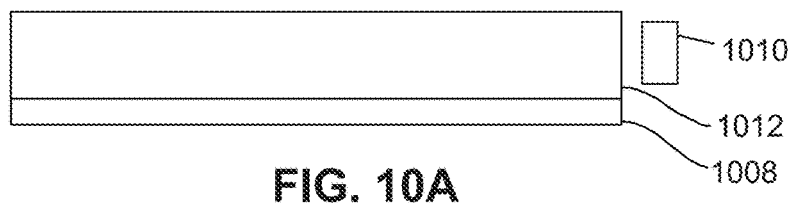
FIGS. 10A-10D illustrate a method for forming a display device, according to an embodiment.

As shown in FIG. 10A, an LGP 1012 can be disposed on a reflector 1008. At least a top surface of LGP 1012 can be formed of glass or other suitable substrate to act as an environmental barrier to resist diffusion of oxygen and other impurities through the surface of LGP 1012. An edge-array of LEDs 1010 can be disposed adjacent to LGP 1012.

Figure 10B:
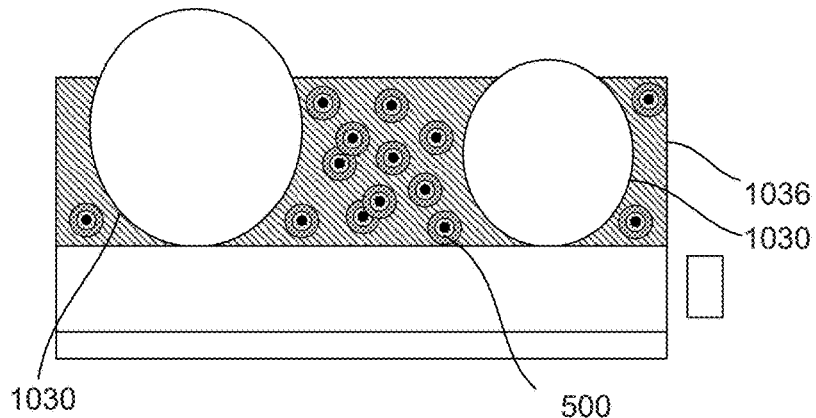

In FIG. 10B, a matrix material 1036 is disposed on LGP 1012. Matrix material 1036 can comprise QDs 500 and microspheres 1030 in a matrix material. More specifically, suitable matrix materials include QDs comprising APS or PEI ligands and one or more epoxy that polymerizes and crosslinks when mixed with the APS or PEI, wherein excess amines cross-link the epoxy.

In an embodiment of forming the matrix material, the QDs are provided in a solvent (e.g., toluene), and the QD-solvent mixture is added to a mixture of the ligand material to coat the QDs. Preferably, the first (ligand) material comprises an amine-containing polymer, suitably APS, or most preferably PEI.

In an embodiment, a QD-toluene mixture is added to a mixture of APS and toluene to provide APS-coated QDs. A matrix material is added to the solvent mixture, followed by evaporation of the solvent. Preferably, an epoxide polymer is added to the mixture, whereby the epoxide is cross-linked by amines of the excess ligand material. Due to the immiscibility of the APS in the epoxy, APS-coated QDs are located in spatial domains throughout the epoxy matrix material. Microspheres 1030 can be dispersed in the matrix material. Although microspheres 1030 larger than the QDs can effective dispersion with minimal mixing, the solution may be mixed sufficiently to achieve a viscosity allows dispersion to be maintained during coating or deposition.

Figure 10C:
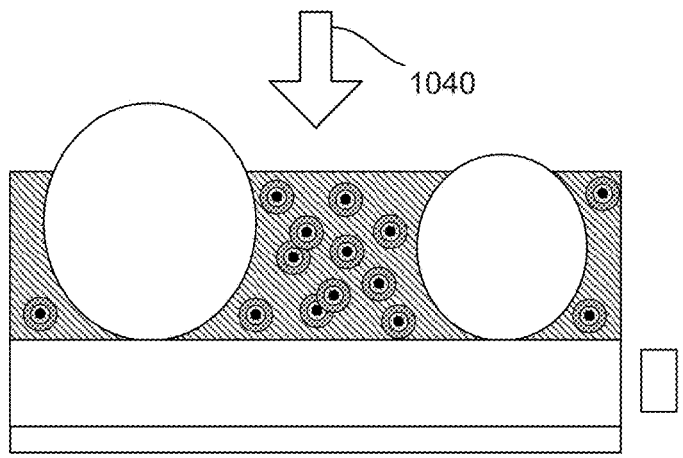

The matrix material is formed from this QD-APS-epoxy mixture, which is preferably mixed with additional base epoxy material, APS that is wet-coated onto a substrate. As shown in FIG. 10C, the matrix material 1036 can be cured to form the QD film. The coated mixture may be thermally cured by heat treatment 1040 and/or can be UV cured. The curing may be performed in phases. For example, the matrix material can be formed in layers, wherein each layer is cured individually.

Figure 10D:
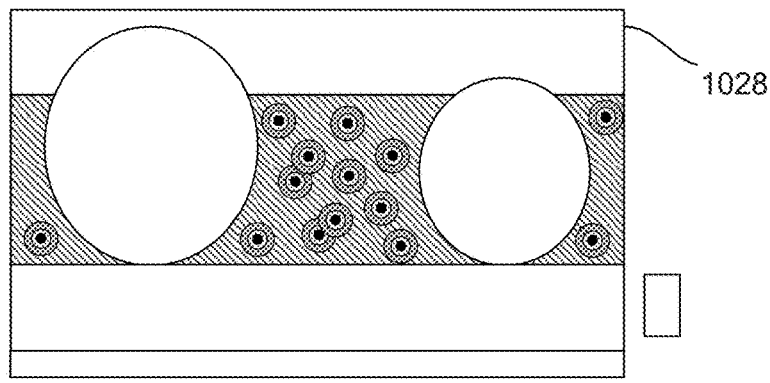

As shown in FIG. 10D, an encapsulation film 1028 deposited on the QD material after the matrix material curing. Alternatively or in addition, matrix material curing may be performed or continued during or after deposition of encapsulation film 1028. As described above, encapsulation film may be glass or other suitable sealing material and may be formed by vacuum deposition or any other suitable method known to persons having ordinary skill in the art.

Figure 11:
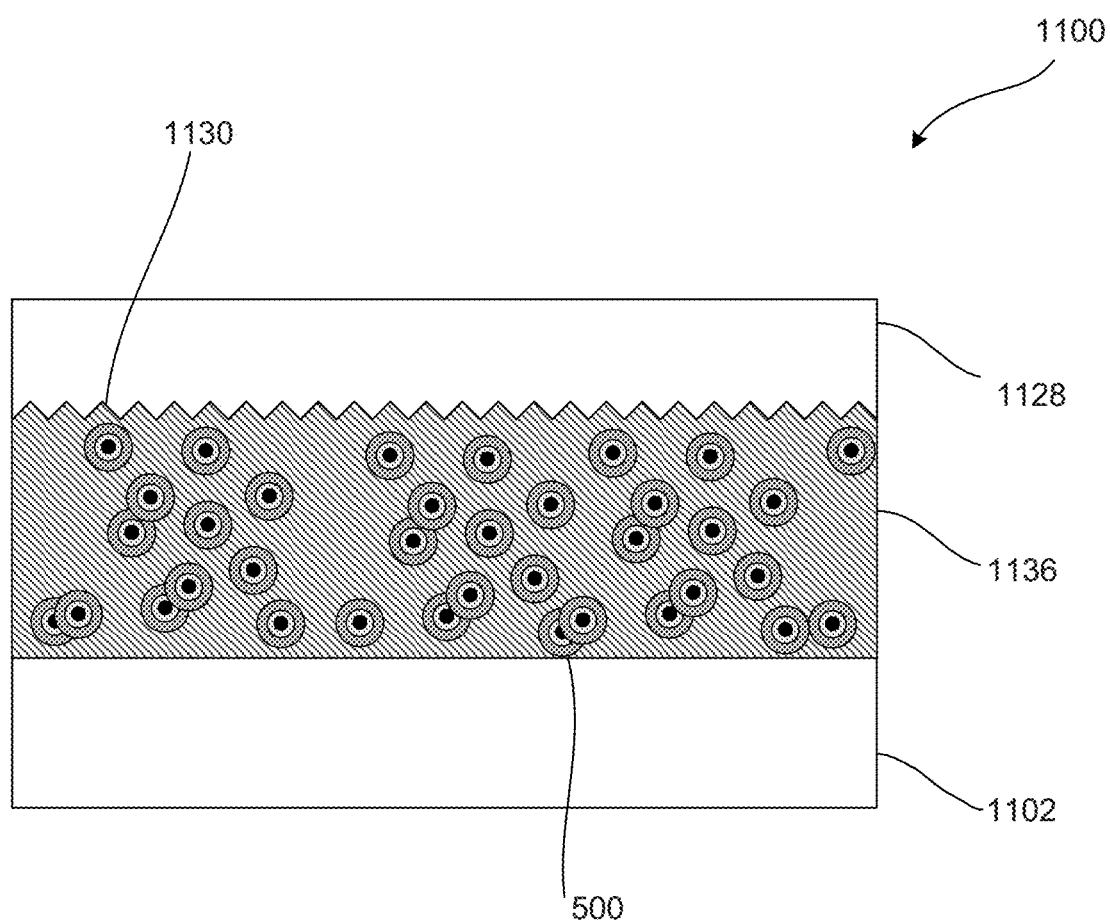
FIG. 11 is a cross-sectional view of a display device, according to an embodiment.

Example Embodiments of Display Device Having a Quantum Dot Film with Embossed Optical Features FIG. 11 depicts a cross-sectional view of a display device 1100, according to an embodiment. Elements shown in other embodiments, such as a liquid crystal module, are omitted herein for better understanding. One of ordinary skill in the art would understand such elements as described above.

A BLU 1102 can include a top surface formed of glass or other suitable substrate. QD film 1136 is disposed on the top surface of BLU 1102. QD film 1136 comprises QDs 500 embedded in a matrix material, such as a resin. QD film 1136 can be formed or processed to include a population of optical features 1130. Optical features 1130 can be configured to exhibit brightness enhancement and other optical enhancement properties. In some embodiments, optical features 1130 can include any of prisms, lenticular lenses, micro-lenses, micro-spheres, any other lenses, pitches, grooves, or other suitable brightness enhancement and/or optical features or any combination thereof. Optical features 1130 can be configured to direct or redirect light emitting from QD film 1136. For example, if optical features 1130 include prisms, light may be directed off-axis when passing through the prism. In such manner, optical features 1130 can enhance the luminance or brightness of light passing emitted by or through QD film 1136. Optical features 1130 can be configured using different types or combinations of features to minimize mura (i.e., unevenness), enhance light diffusion, and/or to further enhance properties of the display. Furthermore, although one layer of optical features 1130 is illustrated, additional layers may be included, stacked or otherwise, to vary the optical characteristics to be enhanced and/or magnitude of the enhancement. Furthermore, QD film 1136 can comprise light blocking elements (as described in above embodiments) that comprise a UV blocking filter. Thereby, light emitting from QD films 1136 can be enhanced for improved optical properties, such as luminance.

An encapsulation film 1128, which can be a thin film encapsulation (TFE) layer, may be disposed conformably on QD film 1136 having, to provide environmental sealing to thereto and to provide a protective barrier. Encapsulation film 1128 can have a thickness of 1 μm or less and may be formed of materials as described in above embodiments.

Method of Manufacturing a Display Device Having a Quantum Dot Film with Integrated Optical Features FIGS. 12A-12F illustrate a method of manufacturing a display device having integrated optical features in a QD film 1236, according to one embodiment. The method of FIGS. 12A-12F is described with reference to an edge-lit backlight unit for illustration purposes only. One of ordinary skill in the art would understand a similar method to form a direct-lit display in accordance with this embodiment, with reference to direct-lit backlight units described above.

Figure 12A:
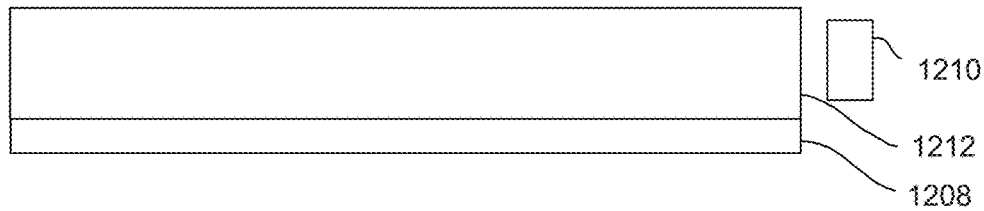
FIGS. 12A-12F illustrate a method for forming a display device, according to an embodiment.

As shown in FIG. 12A, an LGP 1212 can be disposed on a reflector 1208. At least a top surface of LGP 1212 can be formed of glass or other suitable substrate to act as an environmental barrier to resist diffusion of oxygen and other impurities through the surface of LGP 1212. An edge-array of LEDs 1212 can be disposed adjacent to LGP 1212.

Figure 12B:
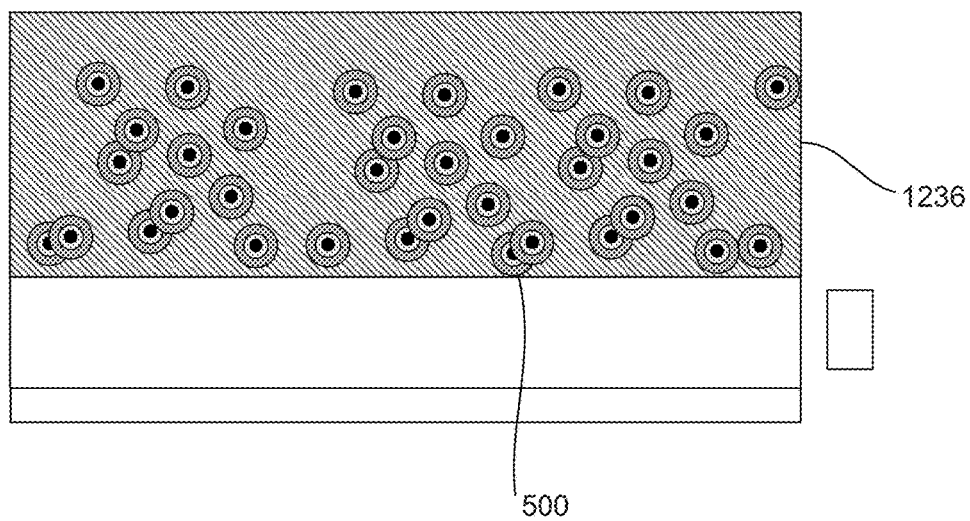

In FIG. 12B, a matrix material 1236 is disposed on LGP 1212. Matrix material 1236 can comprise QDs 500 in a matrix material. More specifically, suitable matrix materials include QDs comprising APS or PEI ligands and one or more epoxide polymer that polymerizes and crosslinks when mixed with the APS or PEI, wherein excess amines crosslink the epoxy.

In an embodiment of forming the matrix material, the QDs are provided in a solvent (e.g., toluene), and the QD-solvent mixture is added to a mixture of the ligand material to coat the QDs. Preferably, the first (ligand) material comprises an amine-containing polymer, suitably APS, or most preferably PEI.

In an embodiment, a QD-toluene mixture is added to a mixture of APS and toluene to provide APS-coated QDs. A matrix material is added to the solvent mixture, followed by evaporation of the solvent. Preferably, an epoxide polymer is added to the mixture, whereby the epoxide is cross-linked by amines of the excess ligand material. Due to the immiscibility of the APS in the epoxy, APS-coated QDs are located in spatial domains throughout the epoxy matrix material. The matrix material is formed from this QD-APS-epoxy mixture, which is preferably mixed with additional base epoxy material, APS that is wet-coated onto a substrate.

Figure 12C:
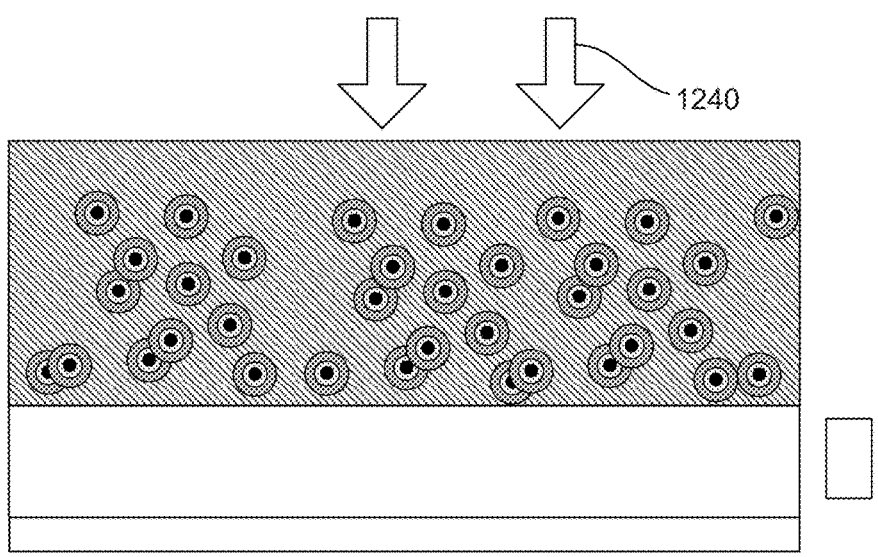

In this embodiment, the curing of matrix material is performed in phases. As shown in FIG. 12C, the matrix material 1236 can be partially cured to form a partially cured QD film. Specifically, the coated mixture may be thermally cured by heat treatment 1240 and/or can be UV cured.

Figure 12D:
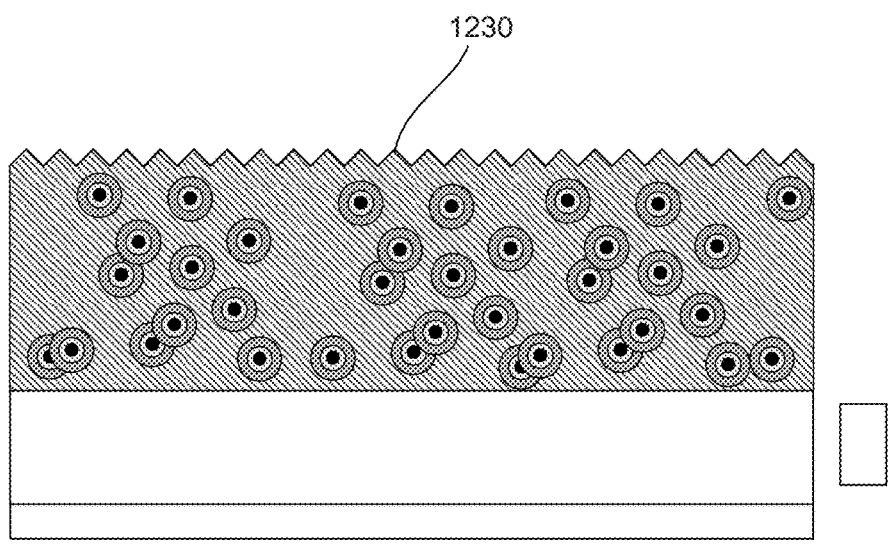

As shown in FIG. 12D, the partially cured matrix material can be etched to emboss a population of optical features 1230 in the surface thereof. The partially cured matrix material may be etched by photo-etching, mechanical etching, chemical etchants or other suitable etching means. Mechanical etching may be preferred to minimize issues involving compatibility between the partially cured matrix material and a chemical etchant.

As described above, the partially cured matrix material may be etched to emboss features, such as such as reflective and/or refractive features, prisms, grooves, grooved prisms, lenticular lenses, micro-lenses, micro-spheres, any other lenses, pitches, or other suitable brightness enhancement and/or optical features. In order to achieve optical properties having suitable effects, it may be necessary to optimize the size of the optical feature. For example, optical features such as prisms may be formed having a size in the range of about 1 μm to about 100 μm, or more preferably about 10 μm to about 30 μm.

Figure 12E:
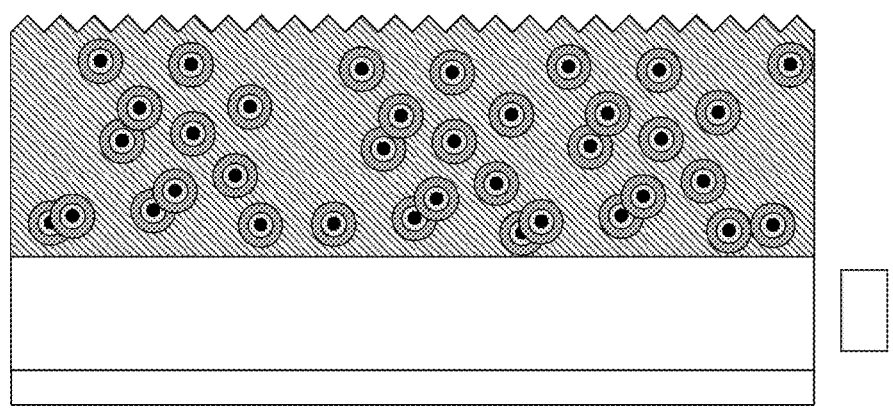
Figure 12F:
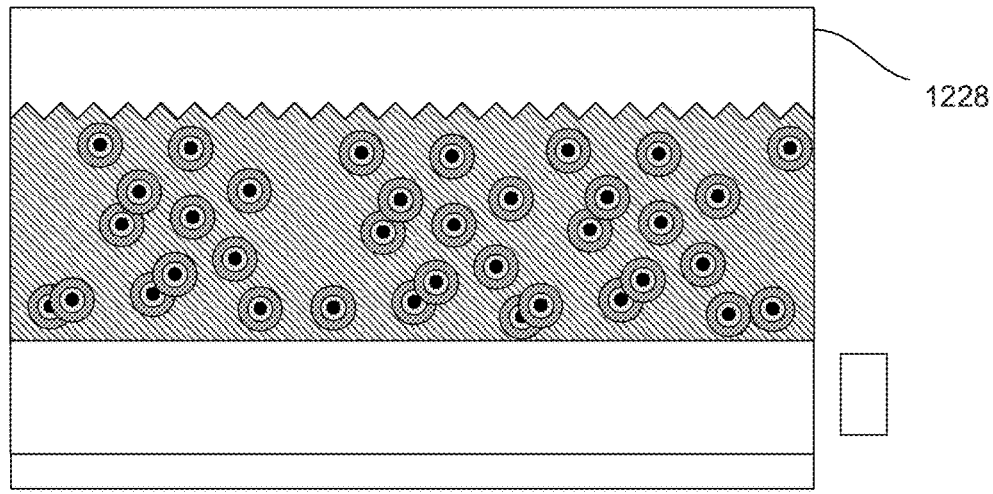

In FIG. 12E, the curing of matrix material 1236 can be continued or completed by a second heat treatment 1241, by UV curing treatment or other suitable process. As shown in FIG. 12F, an encapsulation film 1228 is deposited on the QD material after the matrix material curing. Alternatively or in addition, matrix material curing may be performed or continued during or after deposition of encapsulation film 1228. As described above, encapsulation film may be glass or other suitable sealing material and may be formed by vacuum deposition or any other suitable method known to persons having ordinary skill in the art.

It is to be understood that while some embodiments have been illustrated and described herein, the claims are not to be limited to the specific forms or arrangement of parts described and shown. In the specification, there have been disclosed illustrative embodiments and, although specific terms are employed, they are used in a generic and descriptive sense only and not for purposes of limitation. Modifications and variations of the embodiments are possible in light of the above teachings. It is therefore to be understood that the embodiments may be practiced otherwise than as specifically described.

The breadth and scope of the present invention should not be limited by any of the above-described embodiments, but should be defined only in accordance with the following claims and their equivalents.

What is claimed is:

1. A method for manufacturing a display device comprising:
   forming a backlight unit;
   forming a quantum dot layer over the backlight unit, wherein the quantum dot layer comprises at least one quantum dot and a resin;
   curing the resin; and
   forming an encapsulation layer over the quantum dot layer,
   wherein a top surface of the quantum dot layer comprises at least one optical feature,
   wherein the at least one optical feature is a light enhancing property of a plurality of microspheres dispersed in the quantum dot layer protruding through the top surface, wherein the plurality of microspheres have a size that is greater than a thickness of the quantum dot layer, wherein, by the at least one optical feature, the quantum dot layer is configured to enhance a luminance characteristic or reduce a mura characteristic of the display device, wherein the forming the quantum dot layer comprises disposing, over the backlight unit, the quantum dot layer comprising a plurality of quantum dots embedded in a resin matrix material, and wherein the forming the encapsulation layer comprises disposing, over a non-planar surface of the quantum dot layer, the encapsulation layer comprising a glass sealing material.

2. The method of claim 1, further comprising disposing the plurality of microspheres in the quantum dot layer before curing the resin to form the at least one optical feature of the top surface of the quantum dot layer.

3. The method of claim 2, further comprising distributing the plurality of microspheres in a non-uniform manner in the quantum dot layer, wherein at least one population of the plurality of microspheres is distributed having a non-uniform diameter.

4. The method of claim 2, wherein the disposing of the plurality of microspheres comprises disposing microspheres that comprise glass.

5. The method of claim 2, wherein the disposing of the plurality of microspheres comprises disposing microspheres that comprise a polymer.

6. The method of claim 2, wherein the disposing of the plurality of microspheres comprises disposing microspheres that have a diameter of 10 to 30 micrometers.

7. The method of claim 1,
wherein the forming of the backlight unit comprises forming a backlight unit comprising a light source that emits a primary light, and a light guide panel optically coupled to the light source, and
wherein the forming of the quantum dot layer comprises forming the quantum dot layer over the light guide panel.

8. The method of claim 1,
wherein the forming of the backlight unit comprises forming a backlight unit comprising a light source that emits a primary light, and an optical cavity coupled to the light source, and
wherein the forming of the quantum dot layer comprises forming the quantum dot layer over the optical cavity.

9. A method comprising:
forming, over a backlight unit, a quantum dot layer comprising a plurality of quantum dots embedded in a matrix material,
wherein the quantum dot layer comprises a non-planar surface extending throughout an entirety of a top surface of the quantum dot layer, and
wherein the quantum dot layer is configured to enhance a luminance characteristic or reduce a mura characteristic of a display device; and
forming, over the non-planar surface of the quantum dot layer, an encapsulation layer comprising a sealing material configured to environmentally seal the quantum dot layer,
wherein the sealing material is different from the matrix material,
wherein the forming the quantum dot layer comprises disposing, over the backlight unit, the quantum dot layer comprising the plurality of quantum dots embedded in a resin matrix material, and
wherein the forming the encapsulation layer comprises disposing, over the non-planar surface of the quantum dot layer, the encapsulation layer comprising a glass sealing material.

10. The method of claim 9, wherein the forming the quantum dot layer comprises embossing at least one optical feature in the top surface of the quantum dot layer to form the non-planar surface.

11. The method of claim 10, wherein the embossing the at least one optical feature comprises embossing a plurality of prisms.

12. The method of claim 10, wherein the embossing the at least one optical feature comprises embossing a plurality of lenticular lenses.

13. The method of claim 10, wherein the embossing the at least one optical feature comprises embossing a plurality of spherical lenses.

14. A display device comprising:
a backlight unit comprising a light source that emits a primary light, and a light guide panel optically coupled to the light source;
a quantum dot layer disposed on the light guide panel, the quantum dot layer comprising:
at least one population of quantum dots embedded in a resin material; and
a plurality of microspheres protruding through a top surface of the quantum dot layer; and
an encapsulation layer disposed on the quantum dot layer,
wherein the encapsulation layer covers an irregular top surface of the quantum dot layer,
wherein, by the plurality of microspheres and the irregular top surface, the quantum dot layer is configured to enhance a luminance characteristic or reduce a mura characteristic of the display device,
wherein the plurality of microspheres have a size that is greater than a thickness of the quantum dot layer,
wherein the quantum dot layer is disposed over the backlight unit and comprises a plurality of quantum dots embedded in a resin matrix material, and
wherein the encapsulation layer is disposed over a non-planar surface of the quantum dot layer and comprises a glass sealing material.

15. The display device of claim 14, wherein:
the plurality of microspheres are distributed in a non-uniform manner in the quantum dot layer, thereby forming the irregular top surface of the quantum dot layer; and
at least one population of the plurality of microspheres is distributed having a non-uniform diameter.

16. The display device of claim 14, wherein the plurality of microspheres comprise microspheres comprising glass.

17. The display device of claim 14, wherein the plurality of microspheres comprise microspheres comprising a polymer.

18. The display device of claim 14, wherein each of the plurality of microspheres has a diameter of 10 to 30 micrometers.

19. A method for manufacturing a display device comprising:
forming a backlight unit;
forming a quantum dot layer comprising a resin, at least one population of quantum dots, and a plurality of microspheres protruding through a top surface of the quantum dot layer;
curing the resin of the quantum dot layer; and
forming an encapsulation layer over the quantum dot layer, wherein, by the plurality of microspheres, the quantum dot layer is configured to enhance a luminance characteristic or reduce a mura characteristic of the display device, wherein the plurality of microspheres have a size that is greater than a thickness of the quantum dot layer, wherein the forming the quantum dot layer comprises disposing, over the backlight unit, the quantum dot layer comprising a plurality of quantum dots embedded in a resin matrix material, and wherein the forming the encapsulation layer comprises disposing, over a non-planar surface of the quantum dot layer, the encapsulation layer comprising a glass sealing material.

20. The method of claim 19, wherein:
the plurality of microspheres are distributed in a non-uniform manner in the quantum dot layer; and
at least one population of the plurality of microspheres is distributed having a non-uniform diameter.

21. The method of claim 19, wherein the plurality of microspheres comprise microspheres that comprise glass.

22. The method of claim 19, wherein the plurality of microspheres comprise microspheres that comprise a polymer.

23. The method of claim 19, wherein each of the plurality of microspheres has a diameter of 10 to 30 micrometers.

24. A method for manufacturing a display device comprising:
forming a backlight unit;
forming a quantum dot layer comprising a resin and at least one population of quantum dots;
partially curing resin of the quantum dot layer;
embossing a feature extending throughout an entirety of a top surface of the partially cured resin of the quantum dot layer;
completing the curing of the partially cured resin of the quantum dot layer to form a quantum dot layer having an embossed top surface; and
forming, on the embossed top surface of the quantum dot layer, an encapsulation layer comprising a glass,
wherein, by the feature, the quantum dot layer is configured to enhance a luminance characteristic or reduce a mura characteristic of the display device,
wherein the forming the quantum dot layer comprises disposing, over the backlight unit, the quantum dot layer comprising a plurality of quantum dots embedded in a resin matrix material, and
wherein the forming the encapsulation layer comprises disposing, over a non-planar surface of the quantum dot layer, the encapsulation layer comprising a glass sealing material.

* * * * *